United States Patent
Torii et al.

(10) Patent No.: US 12,125,690 B2
(45) Date of Patent: Oct. 22, 2024

(54) TARGET, FILM FORMING APPARATUS, AND METHOD OF MANUFACTURING FILM FORMATION OBJECT

(71) Applicant: JSW AFTY Corporation, Tokyo (JP)

(72) Inventors: Hironori Torii, Tokyo (JP); Kouji Kageyama, Tokyo (JP)

(73) Assignee: JSW AFTY CORPORATION, Tokyo (JP)

( * ) Notice: Subject to any disclaimer, the term of this patent is extended or adjusted under 35 U.S.C. 154(b) by 419 days.

(21) Appl. No.: 17/426,881

(22) PCT Filed: Dec. 25, 2019

(86) PCT No.: PCT/JP2019/050892
§ 371 (c)(1),
(2) Date: Jul. 29, 2021

(87) PCT Pub. No.: WO2020/158272
PCT Pub. Date: Aug. 6, 2020

(65) Prior Publication Data
US 2022/0102124 A1      Mar. 31, 2022

(30) Foreign Application Priority Data
Jan. 30, 2019   (JP) ................................. 2019-013750

(51) Int. Cl.
*H01J 37/34*      (2006.01)
*C23C 14/34*     (2006.01)

(52) U.S. Cl.
CPC ...... *H01J 37/3435* (2013.01); *C23C 14/3407* (2013.01); *H01J 37/3423* (2013.01)

(58) Field of Classification Search
CPC .. H01J 37/3435; H01J 37/3423; H01J 37/342; H01J 37/3476; H01J 37/3482; C23C 14/3407; C23C 14/357
(Continued)

(56) References Cited

U.S. PATENT DOCUMENTS 3,878,085 A * 4/1975 Corbani ................... H01J 37/34
                                                                 204/192.12
4,274,004 A    6/1981 Kanai
(Continued)

FOREIGN PATENT DOCUMENTS

DE      689 15 014 T2    12/1994
JP         S5947728 A      3/1984
(Continued)

OTHER PUBLICATIONS

Machine Translation JP 06-272034 (Year: 1994).*
(Continued)

*Primary Examiner* — Rodney G McDonald
(74) *Attorney, Agent, or Firm* — McCormick, Paulding & Huber PLLC

(57) ABSTRACT

An object is to extend the life of the target member. The target (TA2) is designed to have a symmetrical structure so as to realize an invertible configuration. According to this, even if the consumption of the target member (71) is large on the side closer to the plasma generation unit where the plasma density is high, the portion of the target member (71) which has been located on the side closer to the film formation object where the plasma density is low and is thus consumed less can be rearranged on the side closer to the plasma generation unit where the plasma density is high, by inverting the target (TA2).

3 Claims, 19 Drawing Sheets

(58) Field of Classification Search
USPC .................... 204/298.12, 298.21, 298.09
See application file for complete search history.

(56) References Cited

U.S. PATENT DOCUMENTS

| | | | |
|---|---|---|---|
| 4,492,620 A | | 1/1985 | Matsuo et al. |
| 4,533,449 A | | 8/1985 | Levenstein |
| 4,911,814 A | | 3/1990 | Matsuoka et al. |
| 5,022,977 A | | 6/1991 | Matsuoka et al. |
| 5,317,006 A | * | 5/1994 | Kumar ................ H01J 37/3277 505/475 |
| 5,334,302 A | | 8/1994 | Kubo |
| 5,911,856 A | | 6/1999 | Suzuki et al. |
| 6,497,803 B2 | * | 12/2002 | Glocker ................ C23C 14/352 204/298.18 |
| 2012/0261253 A1 | | 10/2012 | Madocks et al. |
| 2016/0289820 A1 | | 10/2016 | Madocks et al. |

FOREIGN PATENT DOCUMENTS

| | | | |
|---|---|---|---|
| JP | H04-066663 A | | 3/1992 |
| JP | 06-272034 | * | 9/1994 |
| JP | H07173622 A | | 7/1995 |
| JP | H0860351 A | | 3/1996 |
| JP | H10158831 A | | 6/1998 |
| JP | 2005171328 A | | 6/2005 |
| JP | 2007-538158 A | | 12/2007 |
| JP | 2008-159646 A | | 7/2008 |
| JP | 2013508565 A | | 3/2013 |
| JP | 2015-067856 A | | 4/2015 |
| JP | 2015086447 A | | 5/2015 |
| WO | 88/02546 A | | 4/1988 |

OTHER PUBLICATIONS

Notification of First Office Action corresponding Chinese Patent Application Serial No. 201980089825.6, dated Nov. 9, 2022 and its English translation.
Extended European Search Report for corresponding European Patent Application Serial No. EP 19913702.7, dated Sep. 13, 2022.
Decision of Refusal corresponding Japanese Patent Application Serial No. 2018-194965, dated Feb. 14, 2023 and its partial English translation.
Notification of Reasons for Refusal corresponding to Japanese Patent Application Serial No. 2019-013750, dated Dec. 6, 2022 and its partial English translation.
International Search Report for PCT Serial No. PCT/JP2019/050892 dated Mar. 17, 2020.

* cited by examiner

SIDE OF FILM FORMATION OBJECT

SIDE OF PLASMA GENERATION UNIT

TARGET, FILM FORMING APPARATUS, AND METHOD OF MANUFACTURING FILM FORMATION OBJECT

CROSS-REFERENCE TO RELATED APPLICATIONS

This application is a National Stage application of International Patent Application No. PCT/JP2019/050892, filed on Dec. 25, 2019, which claims priority to Japanese Patent Application No. 2019-013750 filed on Jan. 30, 2019, each of which is hereby incorporated by reference in its entirety.

TECHNICAL FIELD

The present invention relates to a target, a film forming apparatus, and a technology for manufacturing a film formation object, and relates to, for example, a technology for forming a film on a film formation object by the use of plasma.

BACKGROUND

Japanese Unexamined Patent Application Publication No. S59-47728 (Patent Document 1) describes a technology for forming a film on a film formation object by adhering, to the film formation object, target particles ejected from a target member by making ions contained in the plasma generated by using the electron cyclotron resonance (ECR) phenomenon collide with the target member.

SUMMARY

In the sputtering technology, a film is formed on a film formation object by adhering, to the film formation object, target particles ejected from a target member by making ions contained in the plasma collide with the target member. Therefore, when the process of forming a film on a film formation object is performed repeatedly, the target member is consumed. In particular, since the target member is fixed to a support member via a bonding material, if the target member is consumed and the bonding material and the support member are exposed, the ions collide with the bonding material and the support member, so that particles constituting the bonding material and the support member are ejected and adhered to the film formation object. This means that impurities are introduced into the film formed on the film formation object. Therefore, it is necessary to replace the target member before the target member is consumed and the bonding material and the support member are exposed. In this regard, as the frequency of replacement of the target member increases, the running cost of the film forming apparatus increases. Therefore, from the viewpoint of suppressing the running cost, it is desired to extend the life of the target member as much as possible.

Other problems and novel features will be apparent from the description of this specification and the accompanying drawings.

A target according to an embodiment includes a target member having a cylindrical shape and a support member configured to support the target member. The support member has a wall portion in contact with the target member via an adhesive member. Also, the wall portion includes a first portion formed to have a first thickness, a second portion formed to have a second thickness thicker than the first thickness, and a third portion formed to have the first thickness, and the second portion is sandwiched between the first portion and the third portion. Here, the first portion and the third portion are symmetrically arranged with respect to a virtual plane which is orthogonal to a center line of the cylindrical shape and divides the target member into equal halves.

A film forming apparatus according to an embodiment includes a holding unit configured to hold a film formation object, a plasma generation unit configured to generate plasma, a target provided between the holding unit and the plasma generation unit, and a fixing unit configured to fix the target. At this time, the fixing unit includes a main body portion and a pressing portion configured to press the target. In addition, the film forming apparatus further includes a first sealing member in contact with a first portion of the target, a second portion of the target, and the pressing portion of the fixing unit, a second sealing member in contact with the second portion of the target, a third portion of the target, and the main body portion of the fixing unit, and a third sealing member in contact with the main body portion of the fixing unit and the pressing portion of the fixing unit.

A method of manufacturing a film formation object according to an embodiment includes: a step of forming a film on a first film formation object by using a cylindrical target which is provided between a holding unit configured to hold the first film formation object and a plasma generation unit configured to generate plasma and is fixed by a fixing unit (step (a)); and after the step (a), a step of detaching the first film formation object from the holding unit (step (b)). Next, the method manufacturing the film formation object according to the embodiment includes: after the step (b), a step of detaching the target from the fixing unit (step (c)); and after the step (c), a step of inverting the target and attaching the target to the fixing unit (step (d)). Subsequently, the method manufacturing the film formation object according to the embodiment includes: after the step (d), a step of holding a second film formation object by the holding unit (step (e)); and after the step (e), a step of forming a film on the second film formation object by using the target (step (f)).

According to one embodiment, it is possible to extend the life of the target member. As a result, according to one embodiment, it is possible to reduce the running cost of the film forming apparatus.

BRIEF DESCRIPTIONS OF THE DRAWINGS

Figure 11:
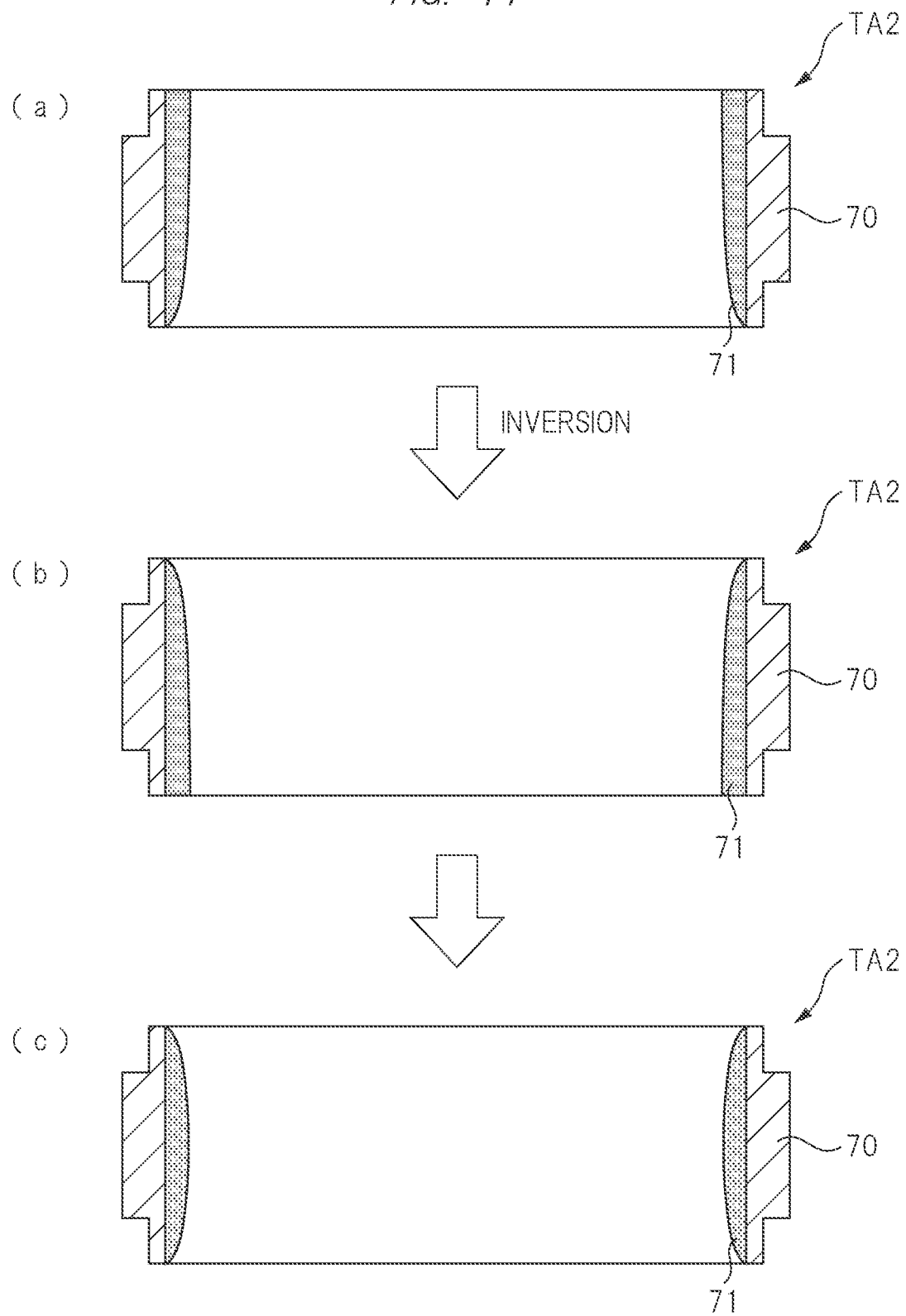
Figure 12:
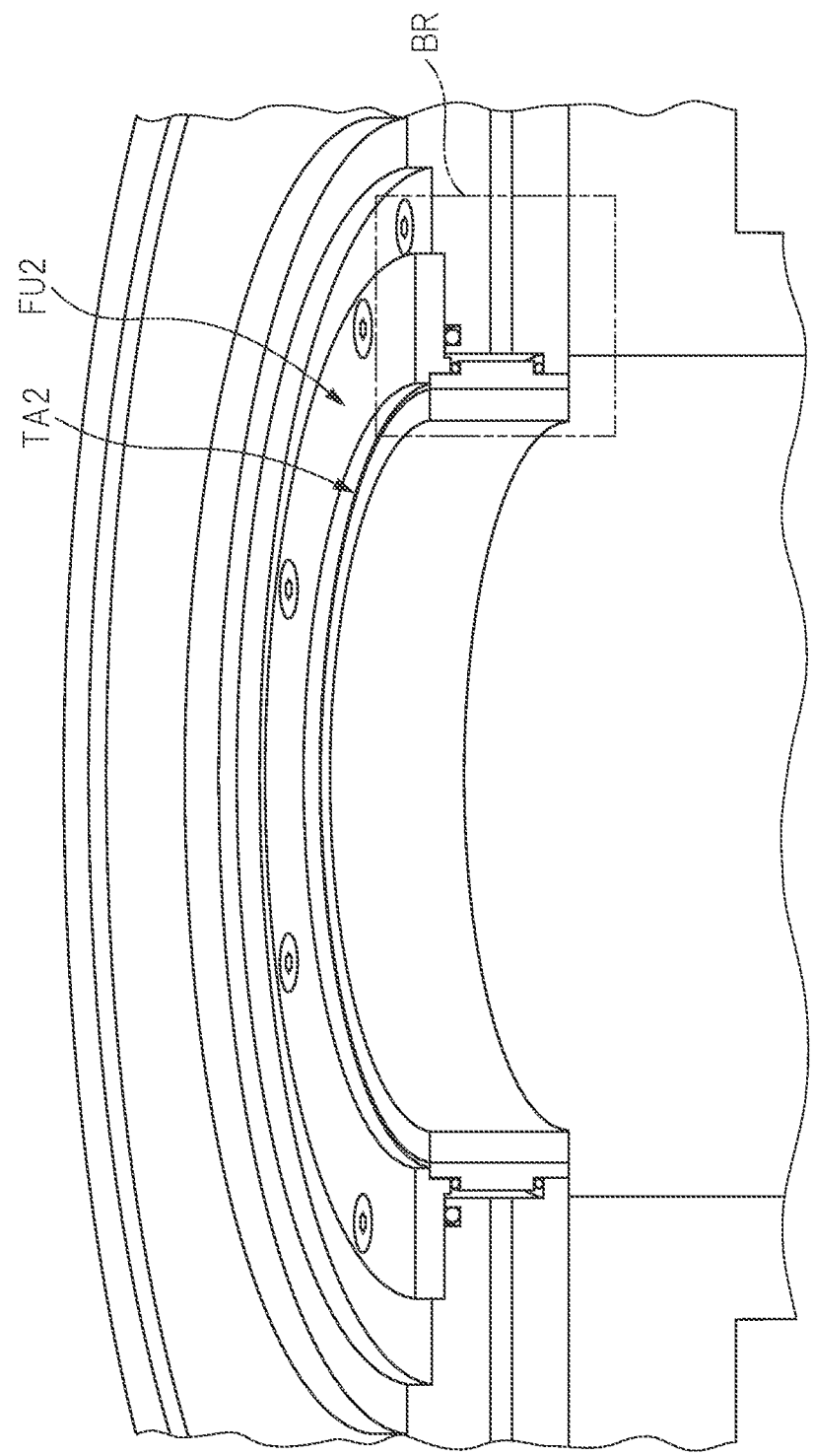
Figure 13:
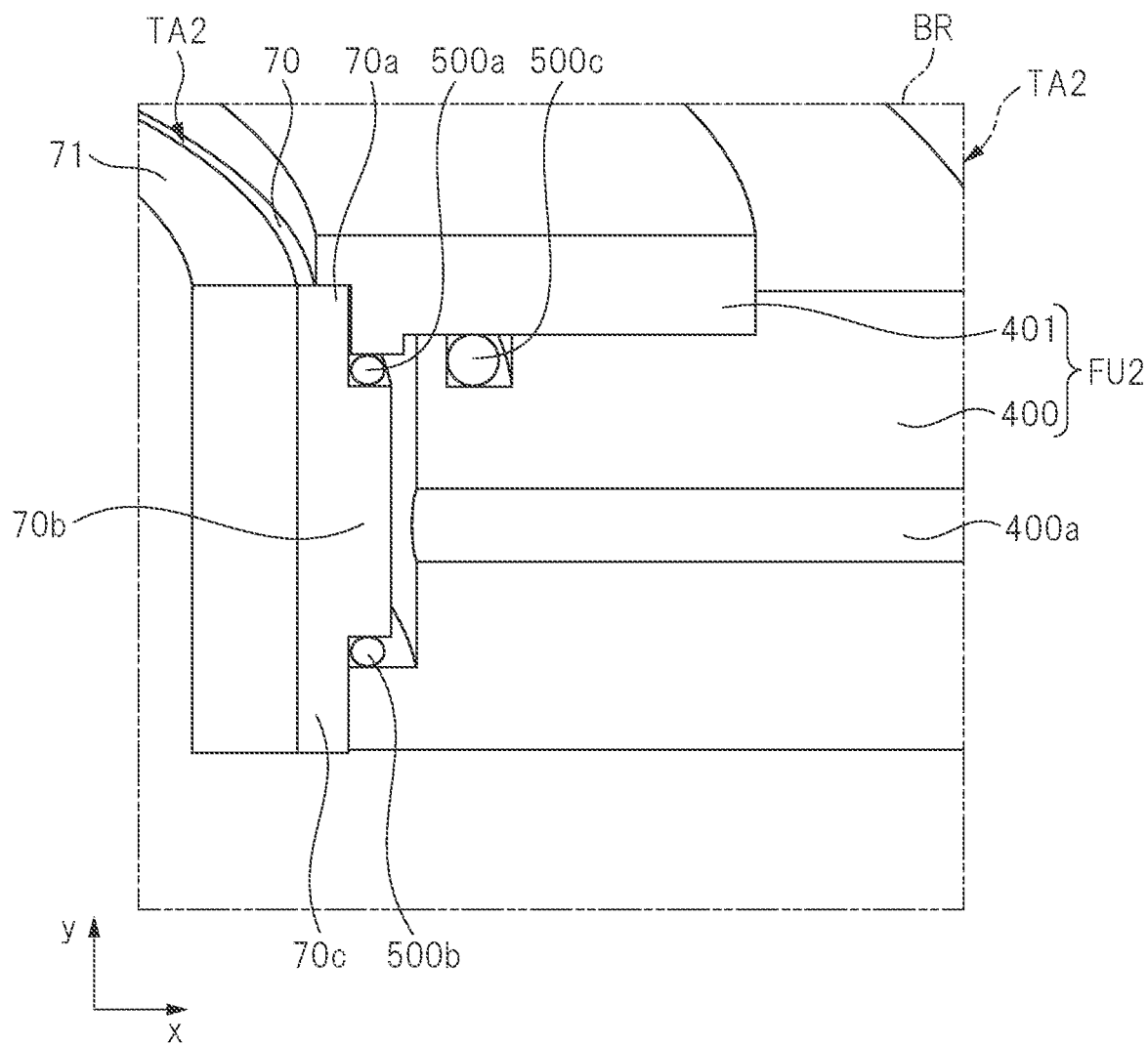
Figure 14:
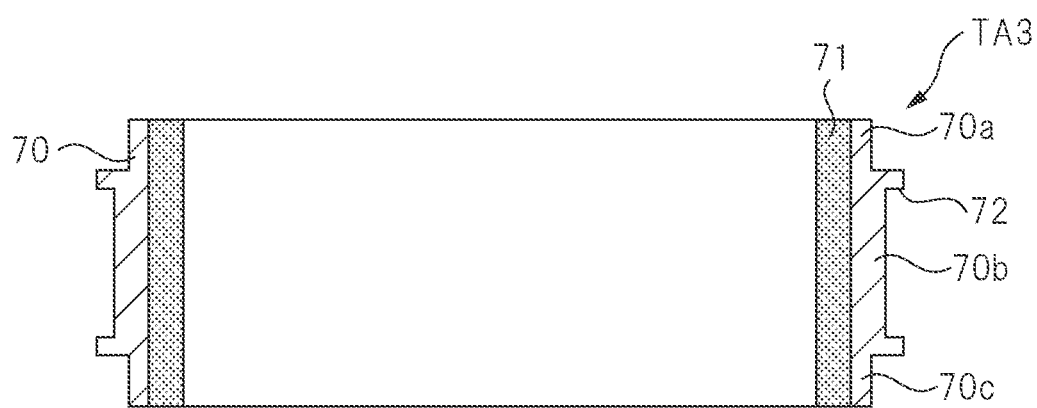
Figure 15:
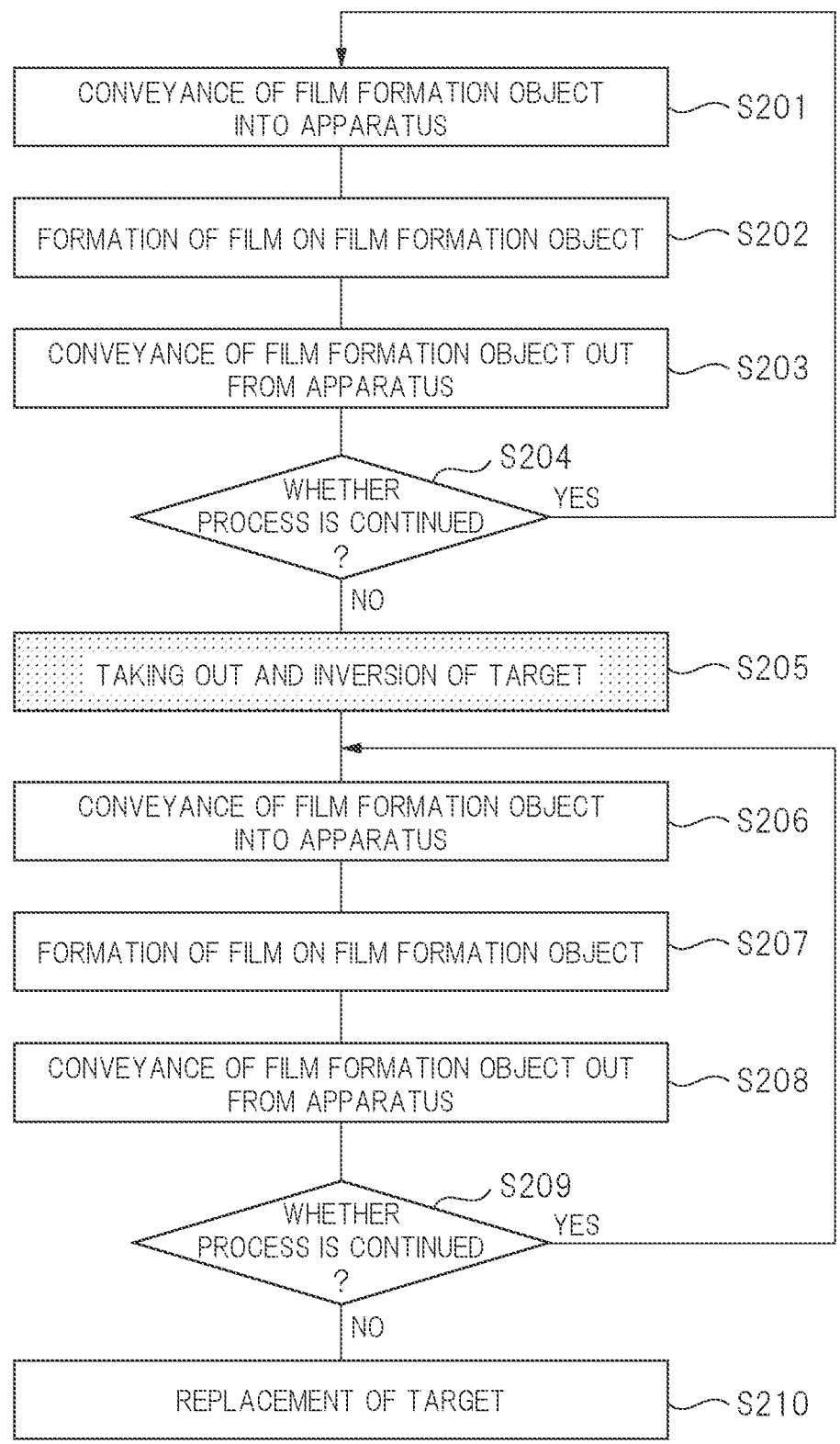
Figure 16:
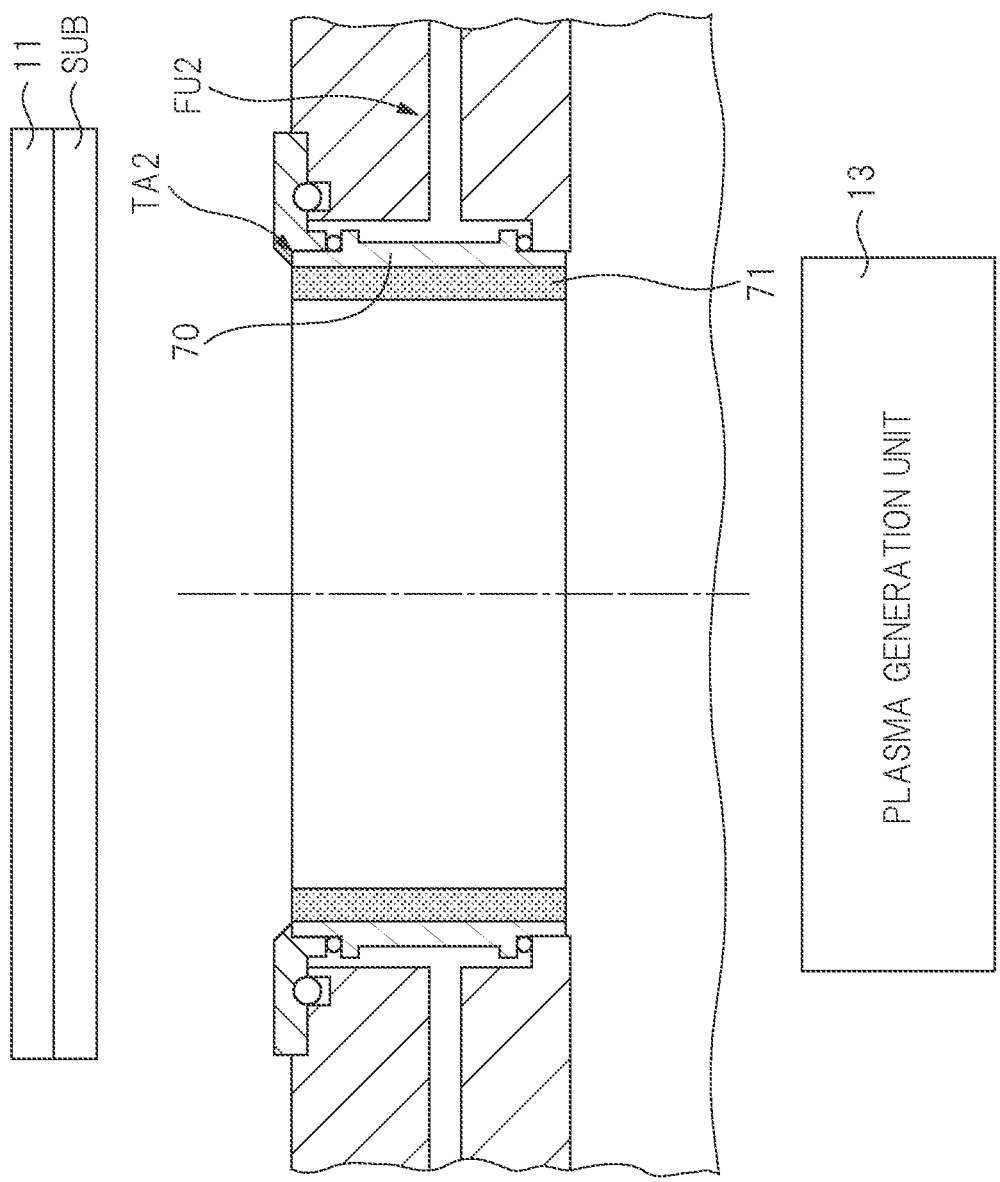
Figure 17:
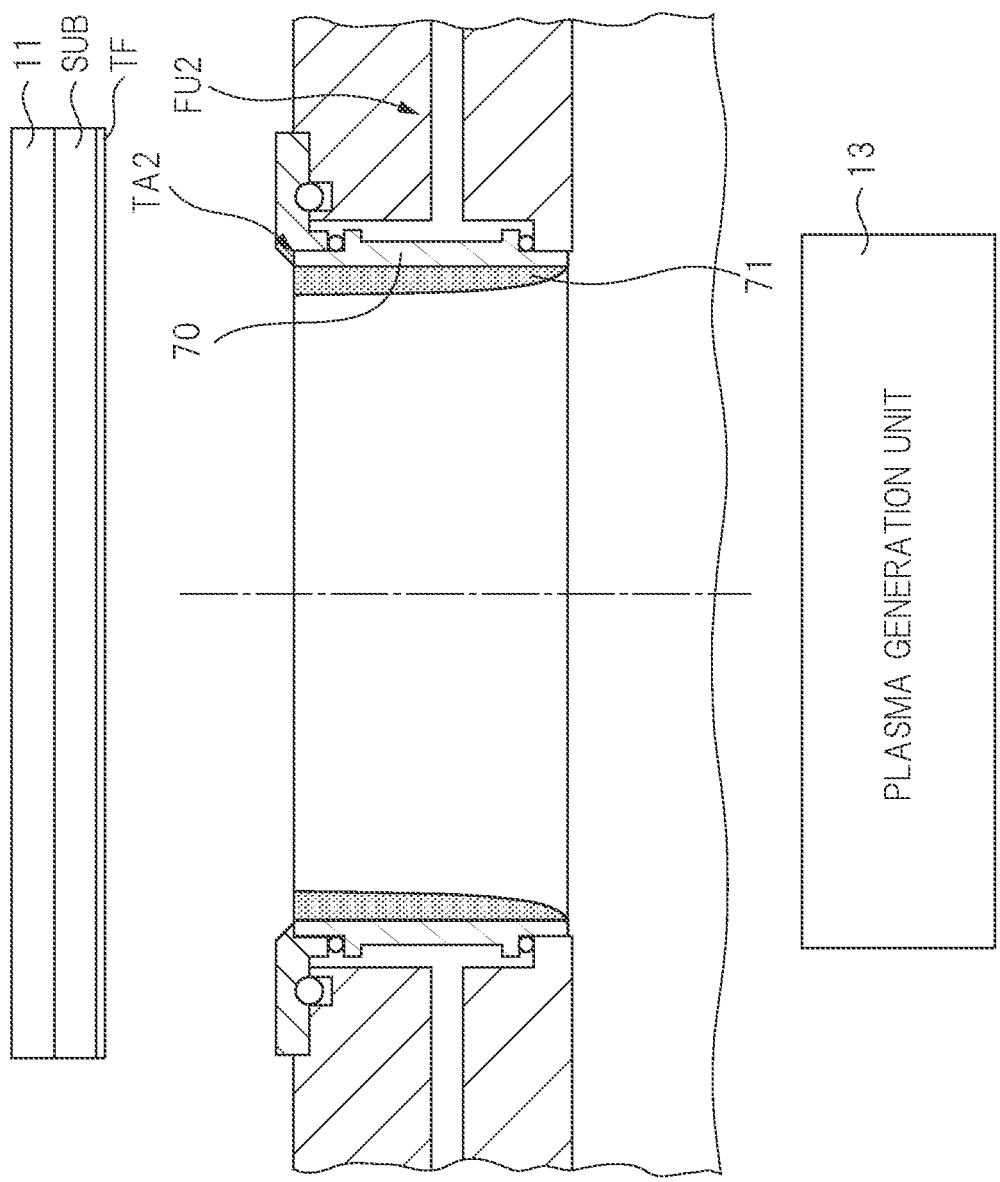
Figure 18:
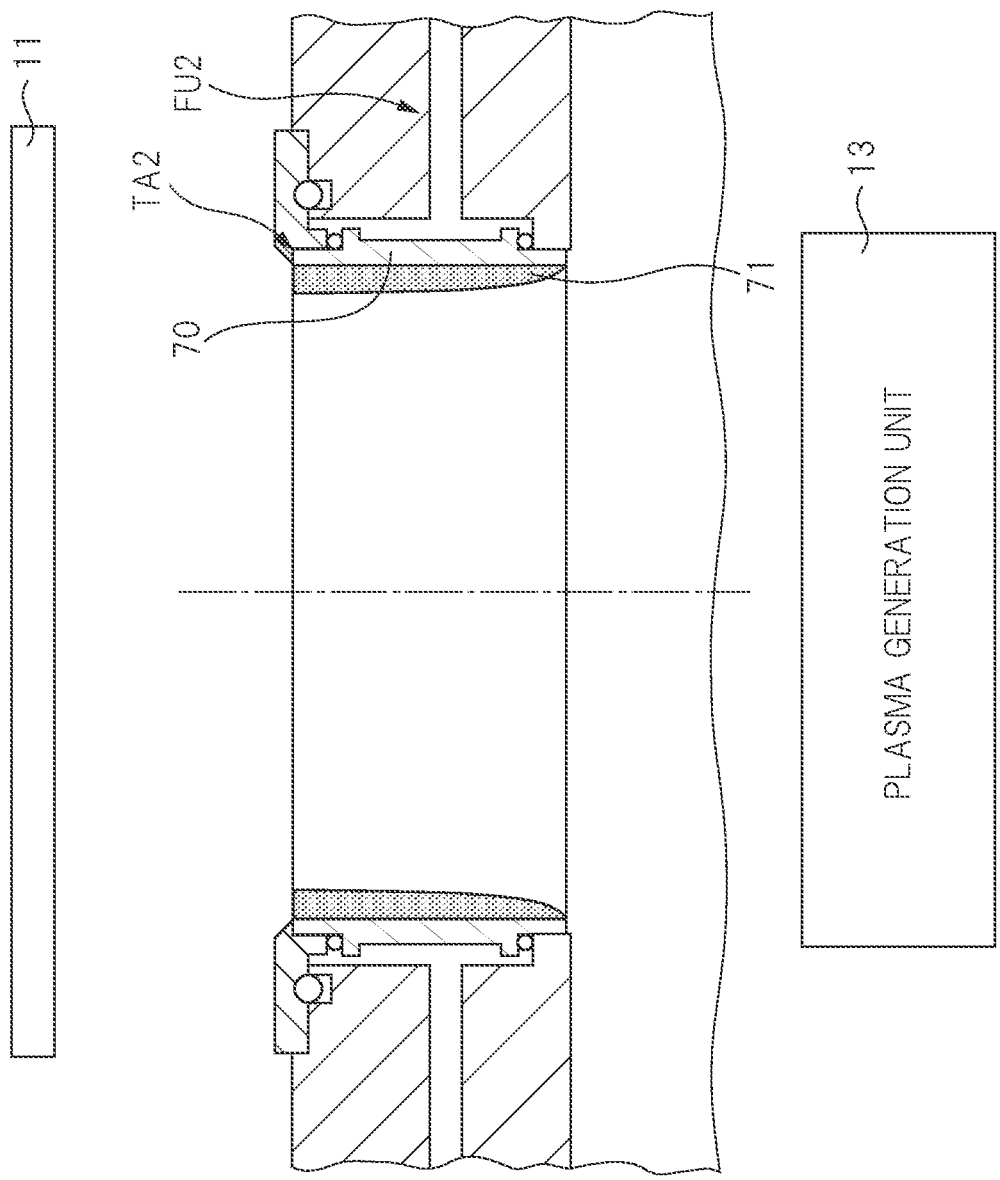
Figure 19:
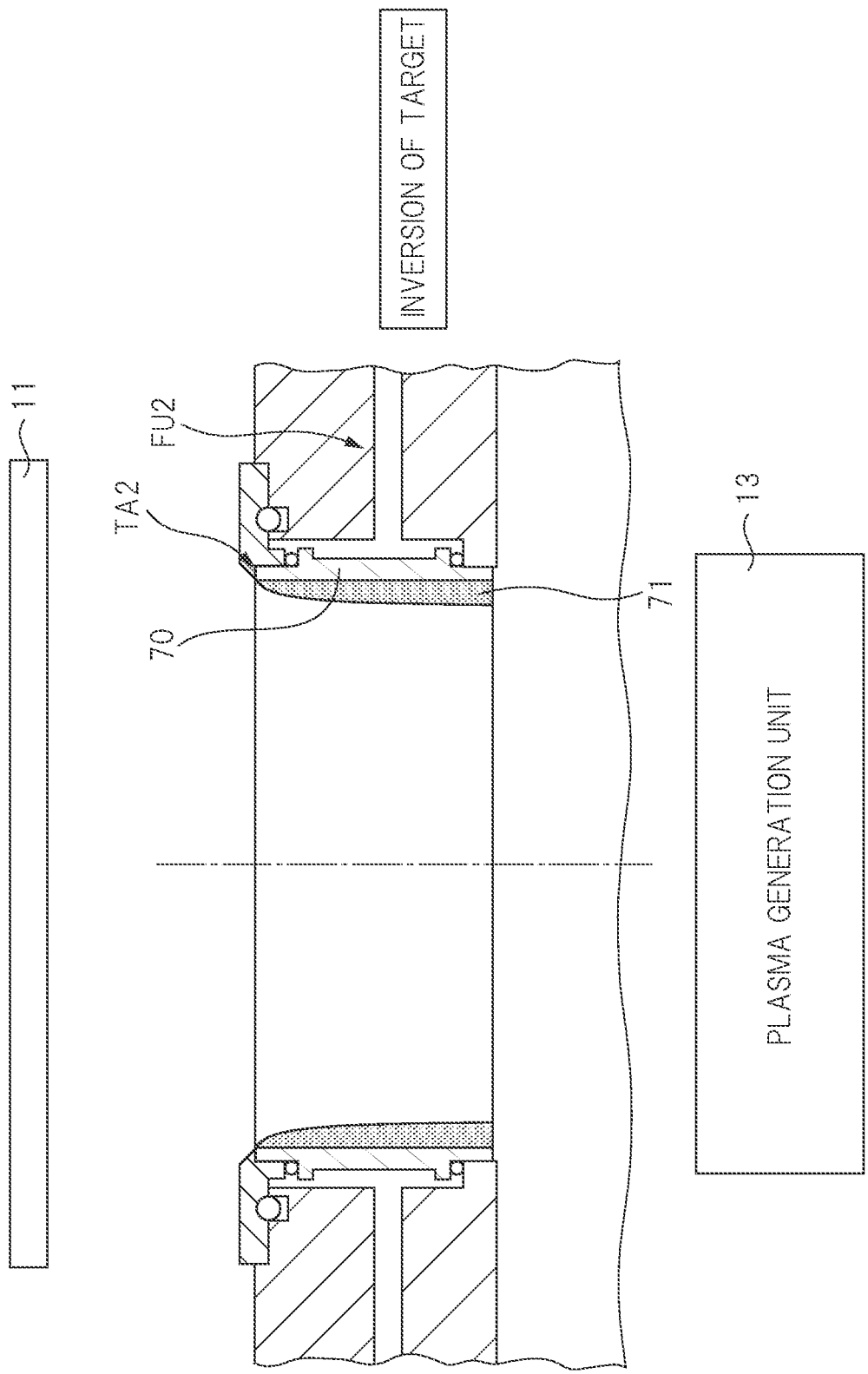
Figure 20:
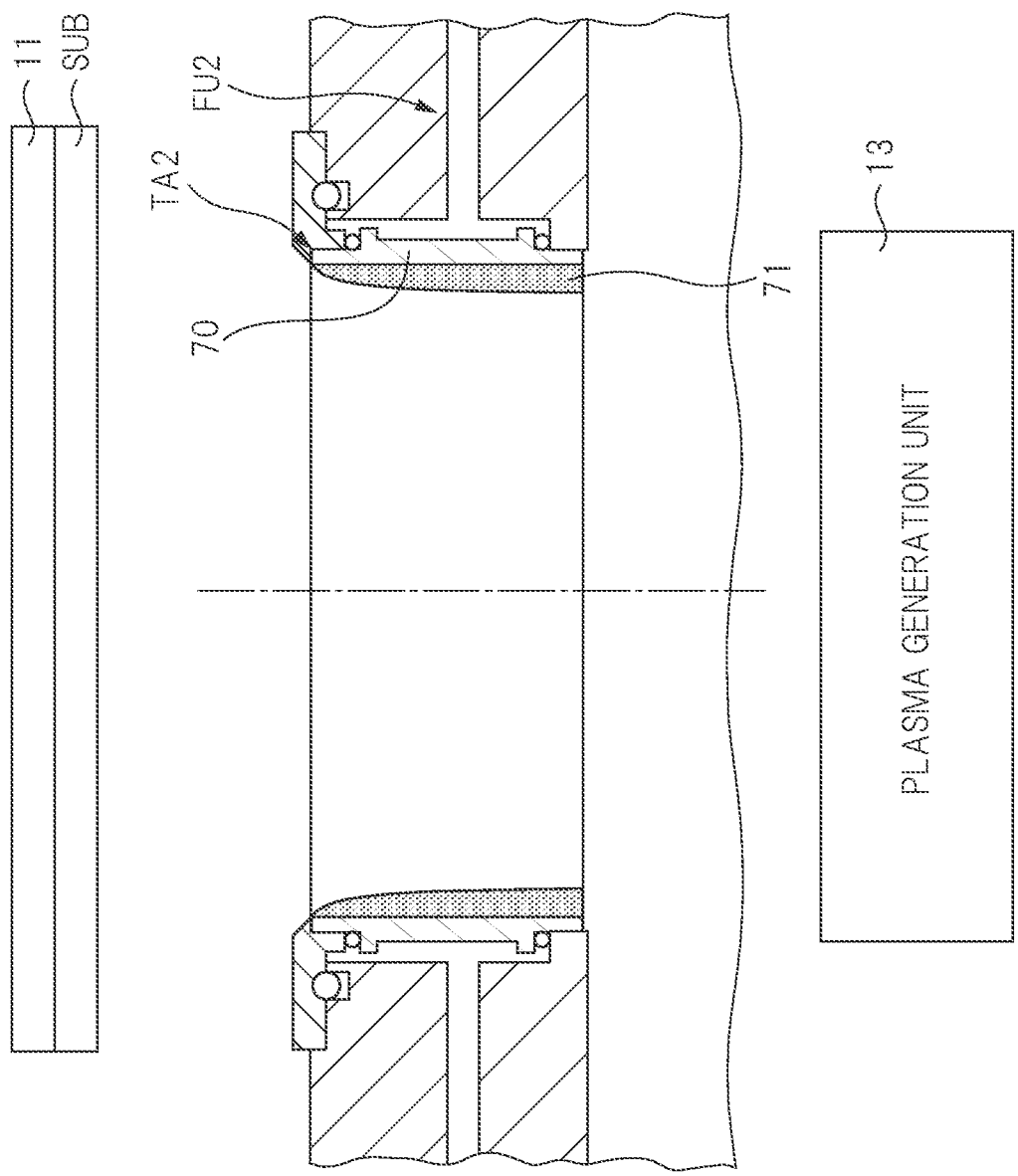
Figure 21:
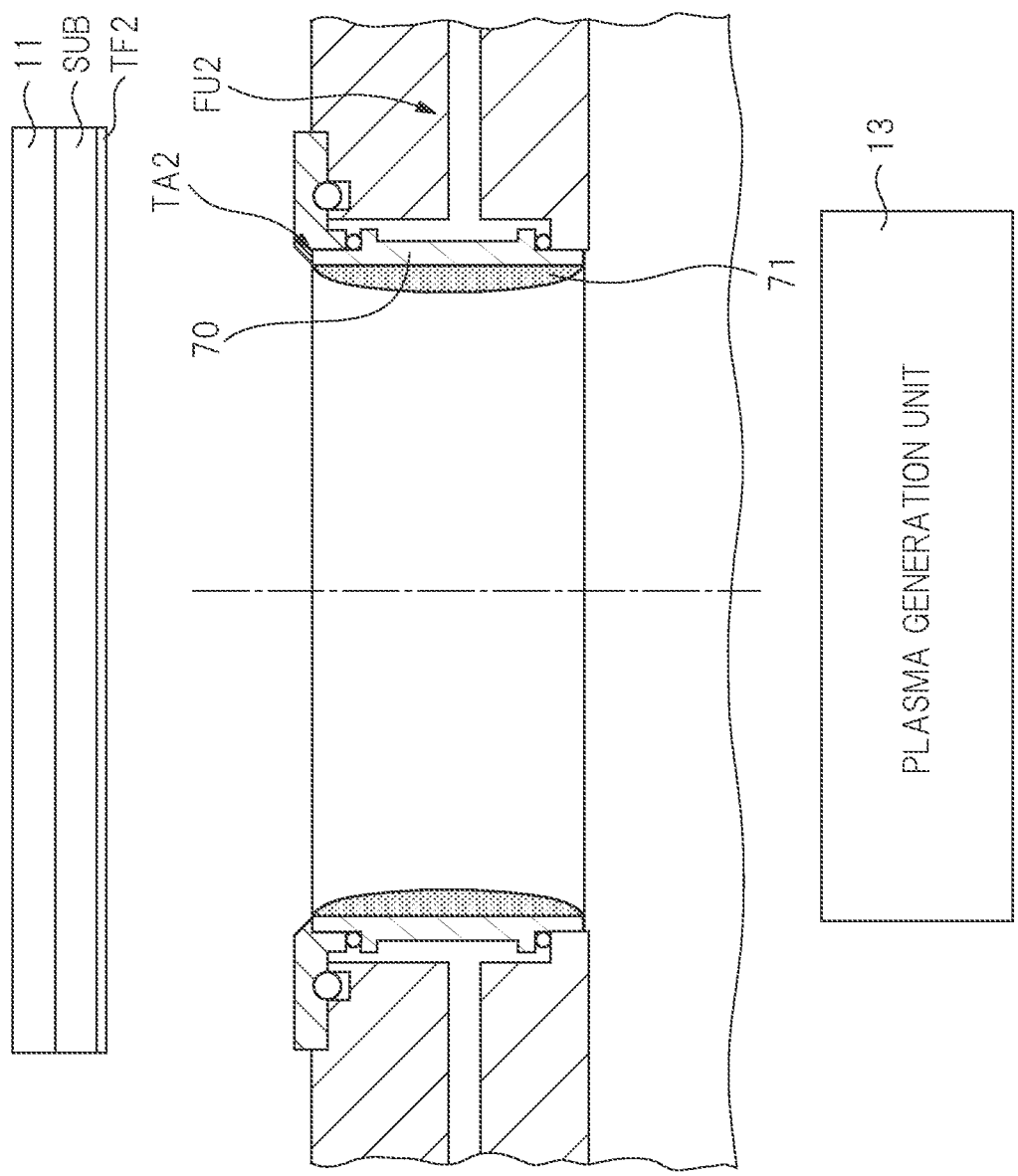
Figure 22:
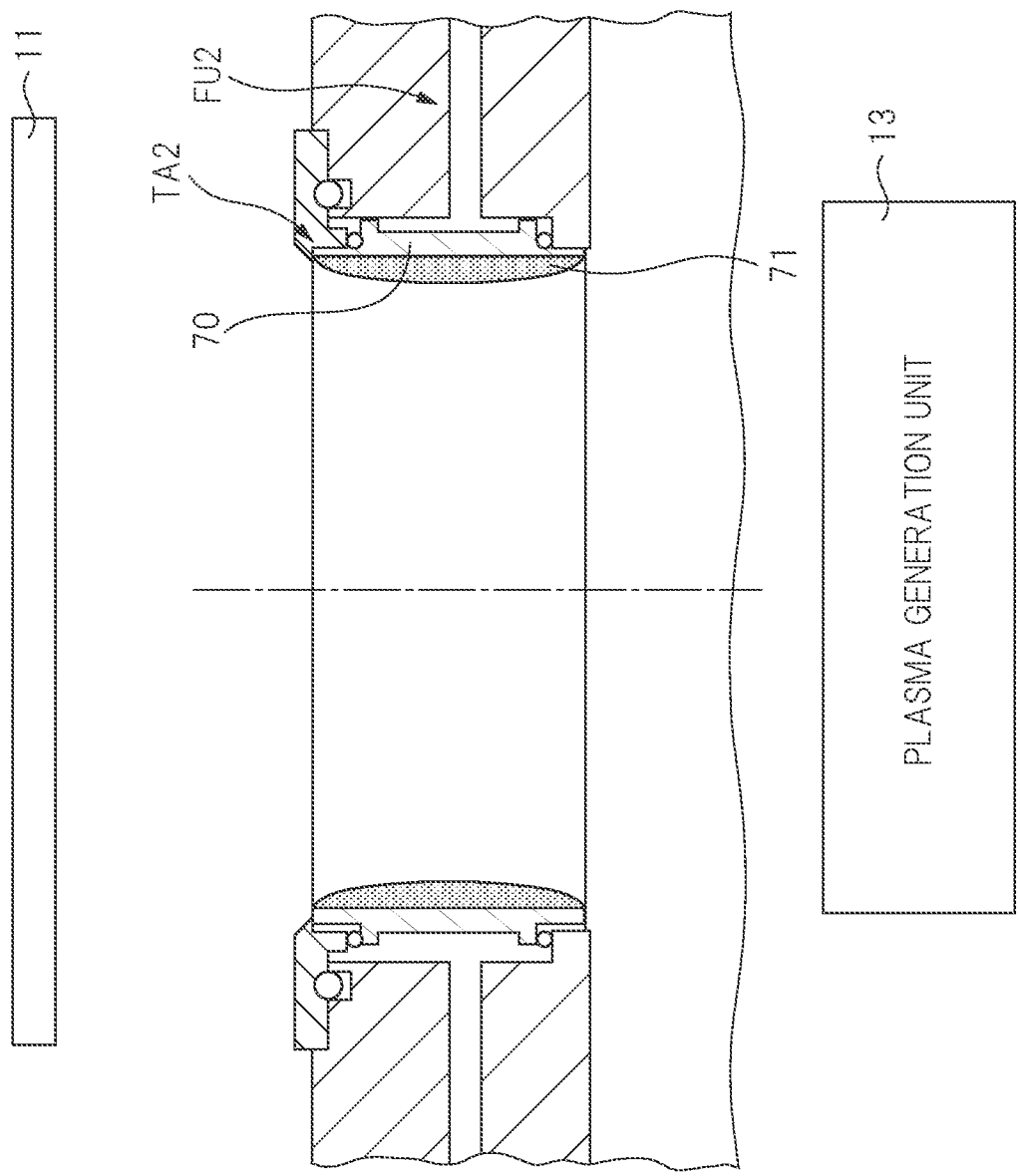

FIG. 11(a) to FIG. 11(c) are diagrams for describing a basic idea in the embodiment;

FIG. 12 is a diagram schematically showing a state in which the target in the embodiment is attached to a fixing unit of the film forming apparatus;

FIG. 13 is a diagram showing a partial region of FIG. 12 in an enlarged manner;

FIG. 14 is a diagram schematically showing a structure of a target in a modification;

FIG. 15 is a flowchart for describing the flow of a method of manufacturing a film formation object;

FIG. 16 is a diagram showing a process of manufacturing the film formation object in the embodiment;

FIG. 17 is a diagram showing the process of manufacturing the film formation object subsequent to FIG. 16;

FIG. 18 is a diagram showing the process of manufacturing the film formation object subsequent to FIG. 17;

FIG. 19 is a diagram showing the process of manufacturing the film formation object subsequent to FIG. 18;

FIG. 20 is a diagram showing the process of manufacturing the film formation object subsequent to FIG. 19;

FIG. 21 is a diagram showing the process of manufacturing the film formation object subsequent to FIG. 20; and FIG. 22 is a diagram showing the process of manufacturing the film formation object subsequent to FIG. 21.

DETAILED DESCRIPTION

In all of the drawings for describing the embodiment, the same members are denoted by the same reference characters and repetitive descriptions thereof will be omitted in principle. Note that hatching may be applied even in a plan view in some cases in order to make the drawings easy to see.

Configuration of Film Forming Apparatus

Figure 1:
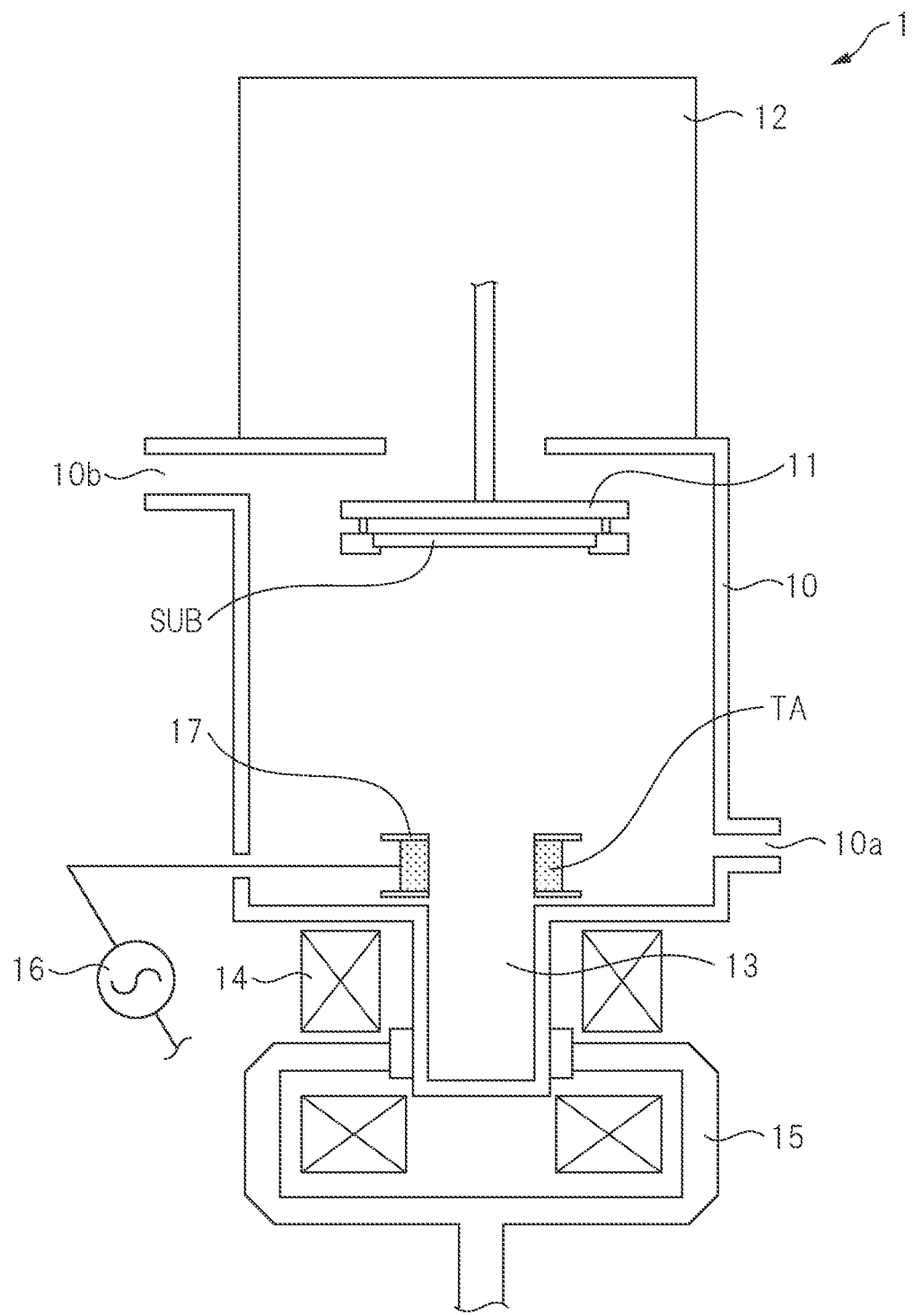
FIG. 1 is a diagram showing a schematic configuration of a film forming apparatus.

FIG. 1 is a diagram showing a schematic configuration of a film forming apparatus.

In FIG. 1, a film forming apparatus 1 includes a chamber 10 which is a film forming chamber. In this chamber 10, a holding unit 11 is provided and a film formation object SUB typified by a substrate is held by this holding unit 11. The holding unit 11 is connected to a mechanism unit 12 arranged close to the chamber 10, and is configured to be operable by the mechanism unit 12. This chamber 10 is provided with a gas introduction port 10a and a gas exhaustion port 10b.

Next, in the chamber 10, a plasma generation unit 13 is provided at a position facing the film formation object SUB held by the holding unit 11. The plasma generation unit 13 is configured to generate plasma, and a magnetic field generation unit 14 composed of, for example, a coil is arranged around the plasma generation unit 13. Also, a waveguide 15 is connected to the plasma generation unit 13, and microwaves propagating through the waveguide 15 are introduced into the plasma generation unit 13. Further, a target TA having, for example, a cylindrical shape is arranged between the holding unit 11 and the plasma generation unit 13, at a position close to the plasma generation unit 13, and the target TA is electrically connected to a high frequency power supply 16. Consequently, the target TA is configured such that the high frequency voltage from the high frequency power supply 16 is applied. This target TA is fixed by a fixing unit 17.

As described above, the film forming apparatus 1 is configured.

Film Forming Operation in Film Forming Apparatus

Next, the film forming operation in the film forming apparatus 1 will be described.

Figure 2:
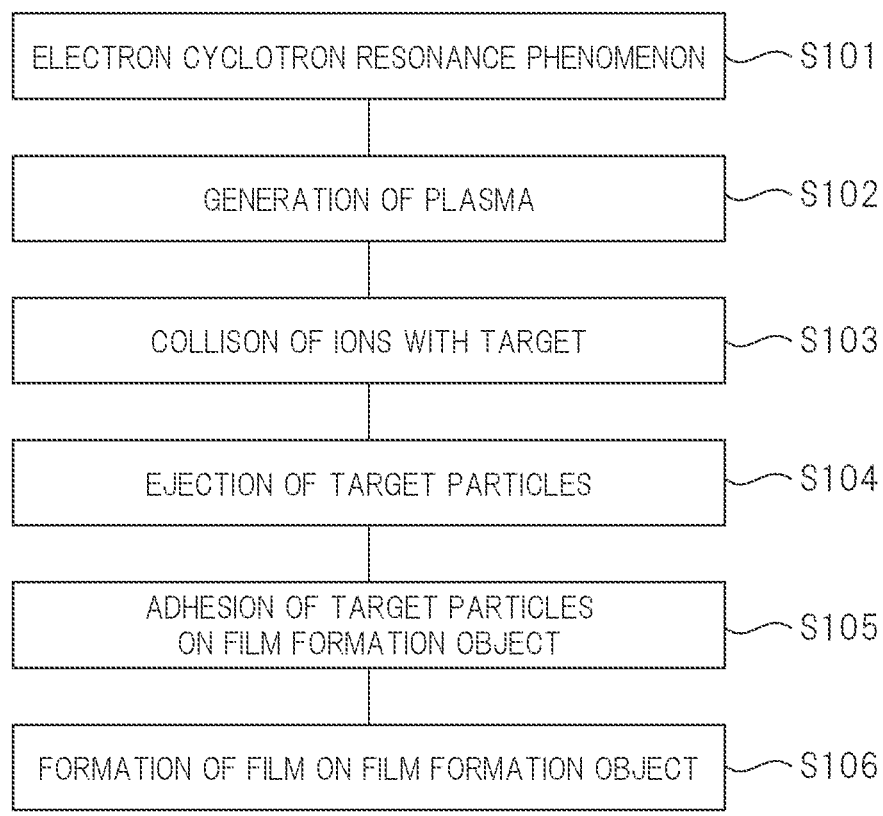
FIG. 2 is a flowchart for describing the flow of the film forming operation.

FIG. 2 is a flowchart for describing the flow of the film forming operation.

First, in FIG. 1, a gas typified by, for example, argon gas is introduced into the plasma generation unit 13. Then, when a magnetic field is generated from the magnetic field generation unit 14 arranged around the plasma generation unit 13, the electrons contained in the gas introduced into the plasma generation unit 13 receive a Lorentz force to make a circular motion. At this time, when microwaves (electromagnetic waves) having the same period (or frequency) as the period (or frequency) of the circular motion of the electrons are introduced from the waveguide 15 into the plasma generation unit 13, the electrons making the circular motion and the microwaves are resonated, so that the energy of the microwaves is efficiently supplied to the electrons making the circular motion (electron cyclotron resonance phenomenon) (S101 in FIG. 2). As a result, the kinetic energy of the electrons contained in the gas increases, and the gas separates into positive ions and electrons. In this manner, a plasma composed of positive ions and electrons is generated (S102 in FIG. 2).

Next, in FIG. 1, a high frequency voltage is supplied from the high frequency power supply 16 to the target TA. In this case, the positive potential and the negative potential are alternately applied to the target TA to which the high frequency voltage is supplied. Here, of the positive ions and electrons constituting the plasma, the electrons having a light mass can follow the high frequency voltage applied to the target TA, while the positive ions having a heavy mass cannot follow the high frequency voltage. As a result, the positive potential that attracts the following electrons is canceled by the negative charge of the electrons, while the average value of the high frequency voltage shifts from 0 V to the negative potential because the negative potential remains. This means that it is possible to consider as if a negative potential is applied to the target TA, though a high frequency voltage is applied to the target TA. As a result, the positive ions are attracted to the target TA, which is considered to be applied with a negative potential on average, and collide with the target TA (S103 in FIG. 2).

Subsequently, when the positive ions collide with the target TA, target particles constituting the target TA receive part of the kinetic energy of the positive ions and are ejected from the target TA into the internal space of the chamber 10 (S104 in FIG. 2). Thereafter, some of the target particles that have been ejected to the internal space of the chamber 10 adhere to the surface of the film formation object SUB held by the holding unit 11 (S105 in FIG. 2). Then, by repeating such a phenomenon, a large number of target particles adhere to the surface of the film formation object SUB, so that a film is formed on the surface of the film formation object SUB (S106 in FIG. 2).

As described above, the film forming operation in the film forming apparatus 1 is realized.

For example, when the target TA is made of aluminum, the target particles are aluminum atoms, and the film formed on the film formation object SUB is an aluminum film. However, when the above-mentioned film forming operation is performed while introducing oxygen gas or nitrogen gas through the gas introduction port 10a provided in the chamber 10 of the film forming apparatus 1 shown in FIG. 1, an aluminum oxide film or an aluminum nitride film can be formed on the surface of the film formation object SUB.

Similarly, when the target TA is made of, for example, silicon, the target particles are silicon atoms, and the film formed on the film formation object SUB is a silicon film. However, when the above-mentioned film forming operation is performed while introducing oxygen gas or nitrogen gas through the gas introduction port 10a provided in the chamber 10 of the film forming apparatus 1 shown in FIG. 1, a silicon oxide film or a silicon nitride film can be formed on the surface of the film formation object SUB.

Advantages of Film Forming Apparatus

The film forming apparatus 1 described above irradiates the film formation object SUB with a plasma flow generated by utilizing the electron cyclotron resonance (ECR) phenomenon and the divergent magnetic field, and simultaneously applies a high frequency voltage between the target TA and the ground, whereby ions in the plasma are caused to collide with the target TA to form a film on the film formation object SUB. If this film forming method is called an ECR sputtering method, this ECR sputtering method has the following advantages.

For example, in the magnetron sputtering method, the order of $10^{-3}$ Torr ($10^{-3} \times 133.32$ Pa) or more is necessary to obtain the stable plasma. On the other hand, in the ECR sputtering method, the stable ECR plasma can be obtained at a pressure on the order of $10^{-4}$ Torr ($10^{-4 \times 133.32}$ Pa). Further, in the ECR sputtering method, since the sputtering is performed by applying the particles (positive ions) in the plasma to the target TA by a high frequency voltage, a film can be formed on the film formation object SUB at a low pressure.

In the ECR sputtering method, the film formation object SUB is irradiated with the ECR plasma flow and the sputtered particles. Since the ions of the ECR plasma flow have an energy of 10 eV to several tens of eV and the pressure is low, the ion current density of the ions reaching the film formation object SUB can be increased. Therefore, the ions of the ECR plasma flow give energy to the raw material particles that are sputtered and fly onto the film formation object SUB, and promote the bonding reaction between the raw material particles and oxygen, so that the quality of the film deposited on the film formation object SUB by the ECR sputtering method is improved. In the ECR sputtering method mentioned above, it is particularly advantageous that a high-quality film can be formed on the film formation object at a low substrate temperature (temperature of the film formation object SUB).

From the above, the film forming apparatus 1 is superior in that it can form a high-quality film. In particular, it can be said that the film forming apparatus 1 is excellent in that a high-quality film can be formed on the surface of the film formation object without exposing the film formation object SUB to a high temperature. Namely, it can be said that the film forming apparatus 1 is extremely excellent in that a high-quality film can be formed on the surface of the film formation object SUB while reducing the damage given to the film formation object SUB.

Advantage of Cylindrical Target

Figure 3:
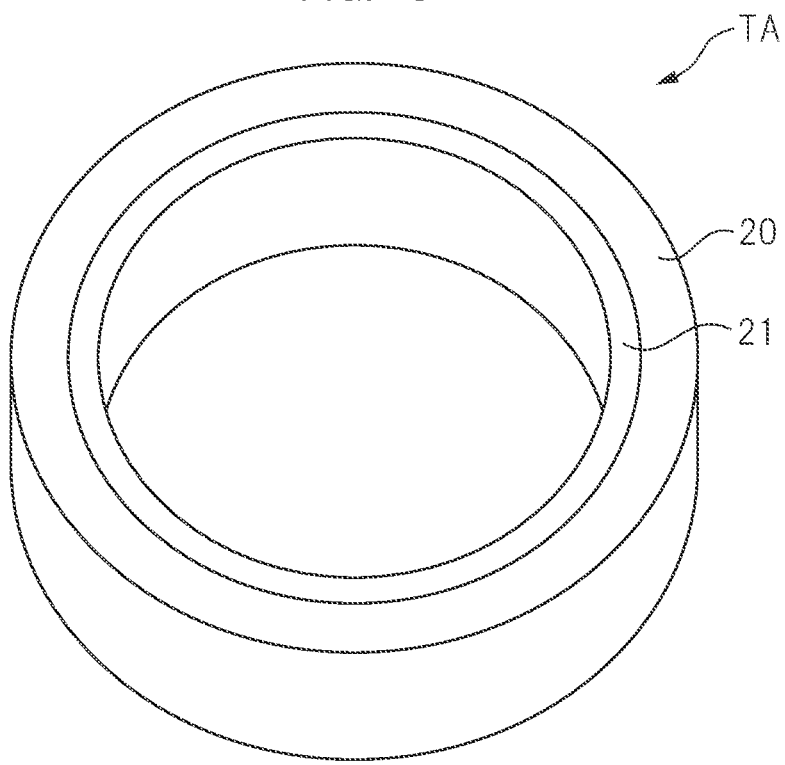
FIG. 3 is a schematic diagram showing an external appearance of a target used in the film forming apparatus.

FIG. 3 is a schematic diagram showing the external appearance of the target TA used in the film forming apparatus 1.

As shown in FIG. 3, the target TA has a cylindrical shape. Specifically, the target TA includes a cylindrical backing tube (support member) 20 made of, for example, a copper material, and a cylindrical target member 21 made of, for example, aluminum is adhered to an inner wall of the backing tube 20 by a bonding material (adhesive material) (not shown).

With the cylindrical target TA configured in this way, it is possible to reduce the damage given to the film formation object SUB as compared with the case of using a generally used disk-shaped target. This advantage will be described below.

Figure 4:
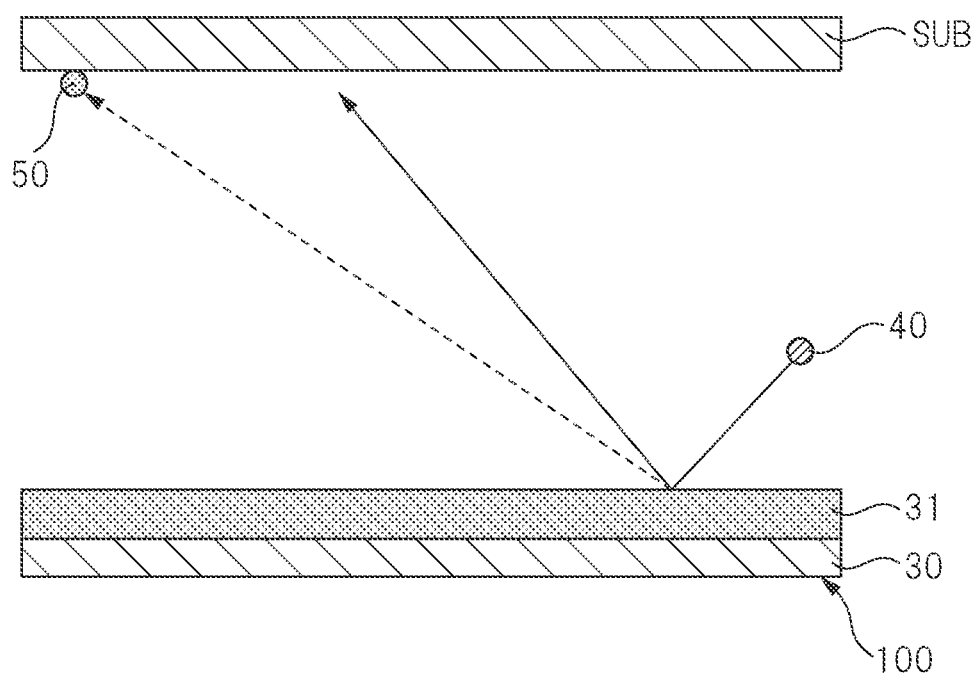
FIG. 4 is a diagram for schematically describing the fact that a film formation object is likely to be damaged when a disk-shaped target is used.

FIG. 4 is a diagram for schematically describing the fact that a film formation object is likely to be damaged when a disk-shaped target is used.

In FIG. 4, a disk-shaped target 100 is arranged so as to face the film formation object SUB. The disk-shaped target 100 includes a support member 30 and a target member 31 arranged on the support member 30. Here, for example, as shown in FIG. 4, when argon ions having kinetic energy collide with the target member 31, target particles 50 are ejected from the target member 31 and adhere to the surface of the film formation object SUB. Consequently, a film composed of the target particles is formed on the surface of the film formation object SUB. However, at this time, argon ions 40 that have collided with the target member 31 are also recoiled, and the film formation object SUB is arranged at the position facing the disk-shaped target 100 when the disk-shaped target 100 is used as shown in FIG. 4. Therefore, as shown in FIG. 4, the recoiled argon ions 40 also tend to collide with the film formation object SUB. Namely, when the disk-shaped target 100 is used to form a film on the surface of the film formation object SUB arranged to face the target 100, not only the target particles 50 to be the component of the film but also the recoiled argon ions 40 are likely to collide with the surface of the film formation object SUB. For this reason, in the film forming apparatus having the configuration in which the disk-shaped target 100 is used to form a film on the surface of the film formation object SUB arranged to face the target 100, there is high possibility that the recoiled argon ions collide with the film formation object SUB, so that the film formation object SUB is likely to be damaged by the recoiled argon ions.

Figure 5:
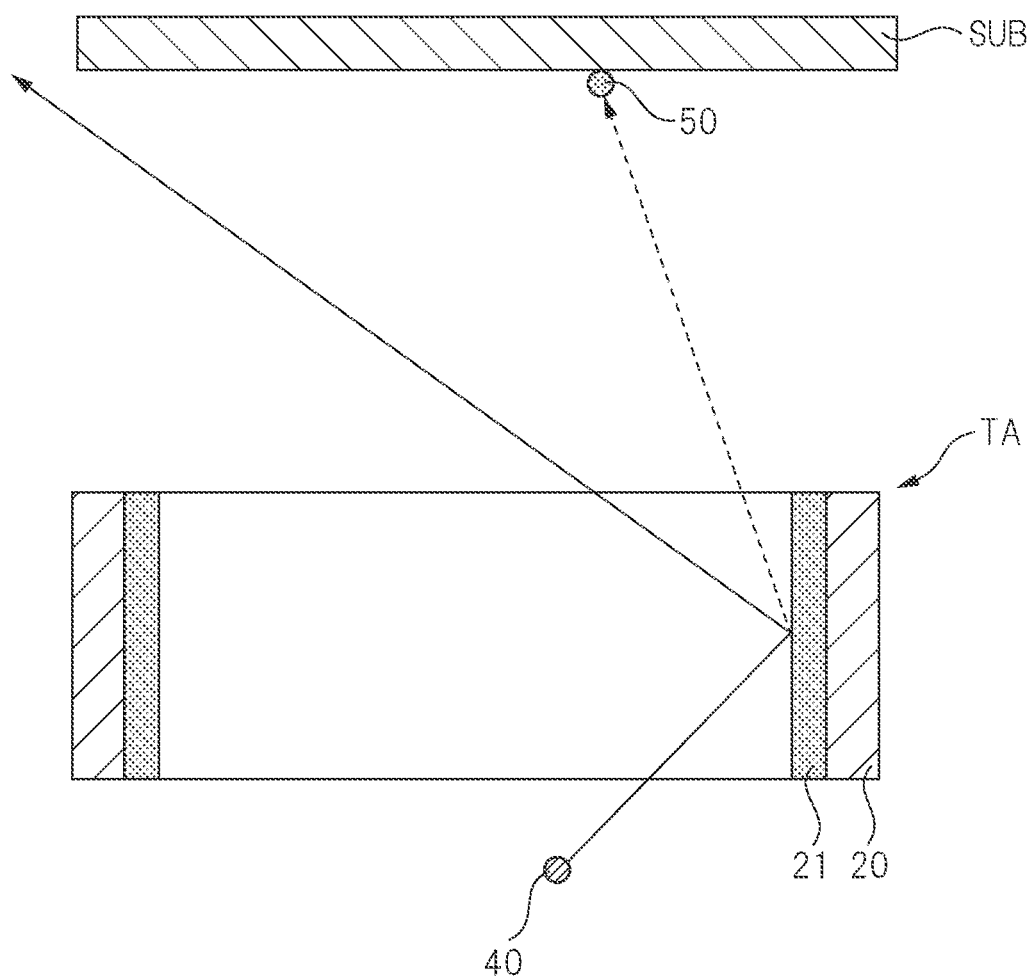
FIG. 5 is a diagram for describing the fact that the damage to the film formation object can be reduced when a cylindrical target is used.

Meanwhile, FIG. 5 is a diagram for describing the fact that the damage to the film formation object can be reduced when a cylindrical target is used.

In FIG. 5, a cylindrical target TA is arranged at the position facing the film formation object SUB. In the cylindrical target TA, the cylindrical target member 21 is arranged on the inner wall of the cylindrical backing tube 20. Therefore, in the target TA shown in FIG. 5, the target member 21 is not arranged to face the film formation object SUB. At this time, as shown in FIG. 5, also in the cylindrical target TA, the argon ions 40 having kinetic energy collide with the target member 21, so that the target particles 50 are ejected from the target member 21 and adhere to the surface of the film formation object SUB. As a result, also when the cylindrical target TA is used, a film made of the target particles 50 can be formed on the surface of the film formation object SUB. Meanwhile, in the cylindrical target TA shown in FIG. 5, unlike the disk-shaped target 100 shown in FIG. 4, the target member 21 itself is not arranged to face the film formation object SUB. Accordingly, as shown in FIG. 5, in the cylindrical target TA, the probability that the argon ions 40 that have recoiled after colliding with the target member 21 collide with the film formation object SUB is reduced. Therefore, in the film forming apparatus having the configuration in which the cylindrical target TA is used to form a film on the surface of the film formation object SUB, the probability that the recoiled argon ions collide with the film formation object SUB is reduced, so that it is possible to reduce the damage to the film formation object SUB due to the collision of the recoiled argon ions with the film formation object SUB.

From the above, with the cylindrical target TA shown in FIG. 5, it is possible to obtain the advantage that the damage to the film formation object SUB can be reduced as compared with the case where the generally used disk-shaped target 100 (see FIG. 4) is used.

However, according to the studies by the inventors, it has been newly found that the film forming apparatus using the cylindrical target TA has the advantage that damage to the film formation object SUB can be reduced, but there is room for improvement from the viewpoint of extending the life of the cylindrical target TA.

In the following, the room for improvement existing in the cylindrical target TA newly found by the inventors will be first described by using a related art.

Room for Improvement Peculiar to Cylindrical Target

Figure 6:
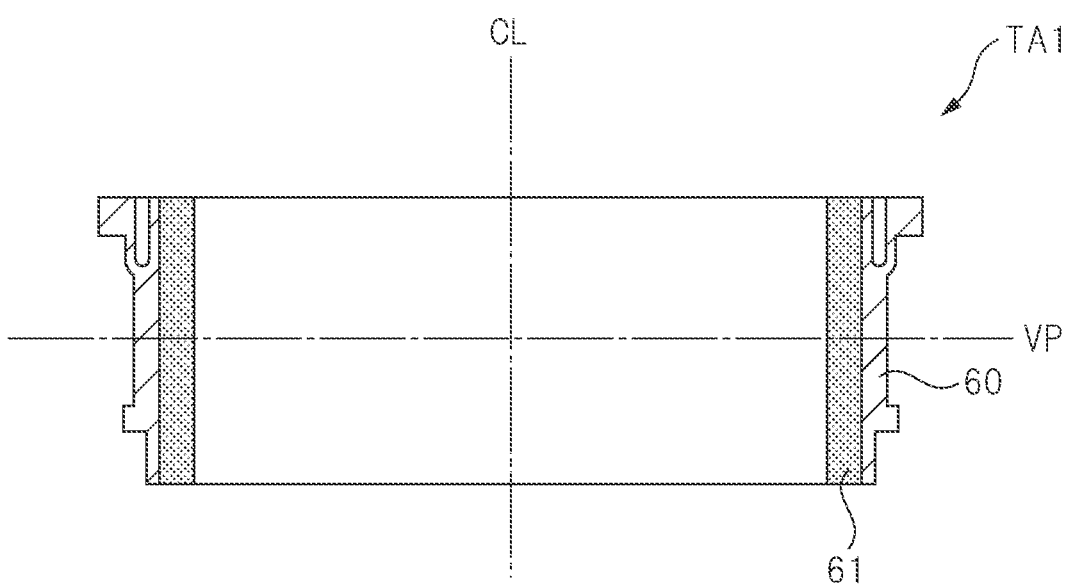
FIG. 6 is a cross-sectional view showing a schematic configuration of a target in a related art.

FIG. 6 is a cross-sectional view showing a schematic configuration of a target TA1 in the related art.

In FIG. 6, the target TA1 in the related art has a substantially cylindrical shape, and includes a substantially cylindrical backing tube 60 and a target member 61 adhered to an inner wall of the backing tube 60 via a bonding material (not shown) made of indium. At this time, as shown in FIG. 6, it can be seen that the backing tube 60 that supports the target member 61 has a vertically asymmetrical structure. Therefore, the target TA1 including the vertically asymmetrical backing tube 60 also has a vertically asymmetrical structure. In other words, as shown in FIG. 6, the target TA1 in the related art has a structure asymmetrical with respect to a virtual plane VP which is orthogonal to a center line CL of the cylindrical shape and divides the target member 61 into equal halves.

Figure 7:
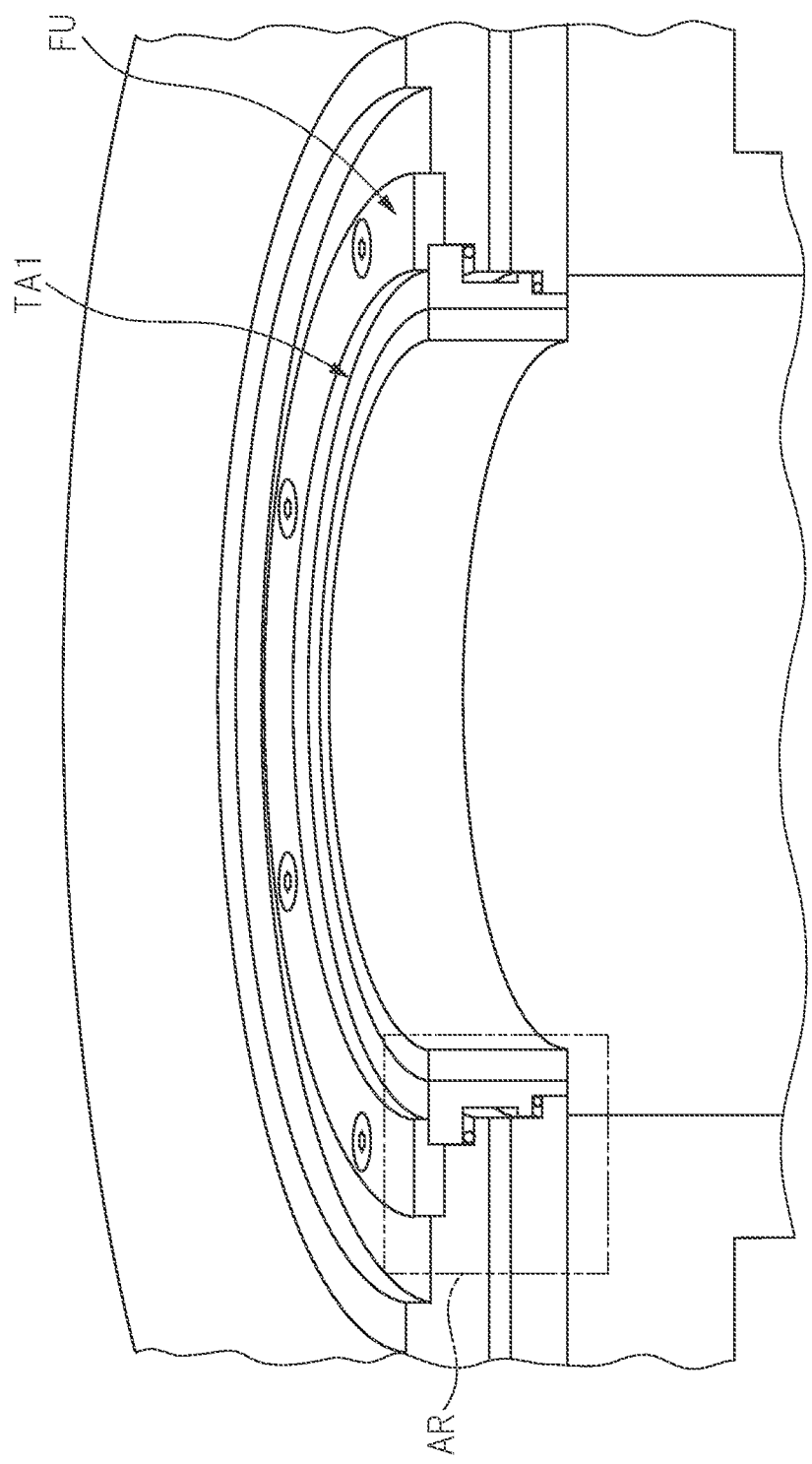
FIG. 7 is a diagram schematically showing a state in which a target in the related art is attached to a fixing unit of the film forming apparatus.

Next, FIG. 7 is a diagram schematically showing a state in which the target TA1 in the related art is attached to a fixing unit FU of the film forming apparatus. In FIG. 7, it can be seen that the target TA1 in the related art is fixed by the fixing unit FU provided in the film forming apparatus.

Figure 8:
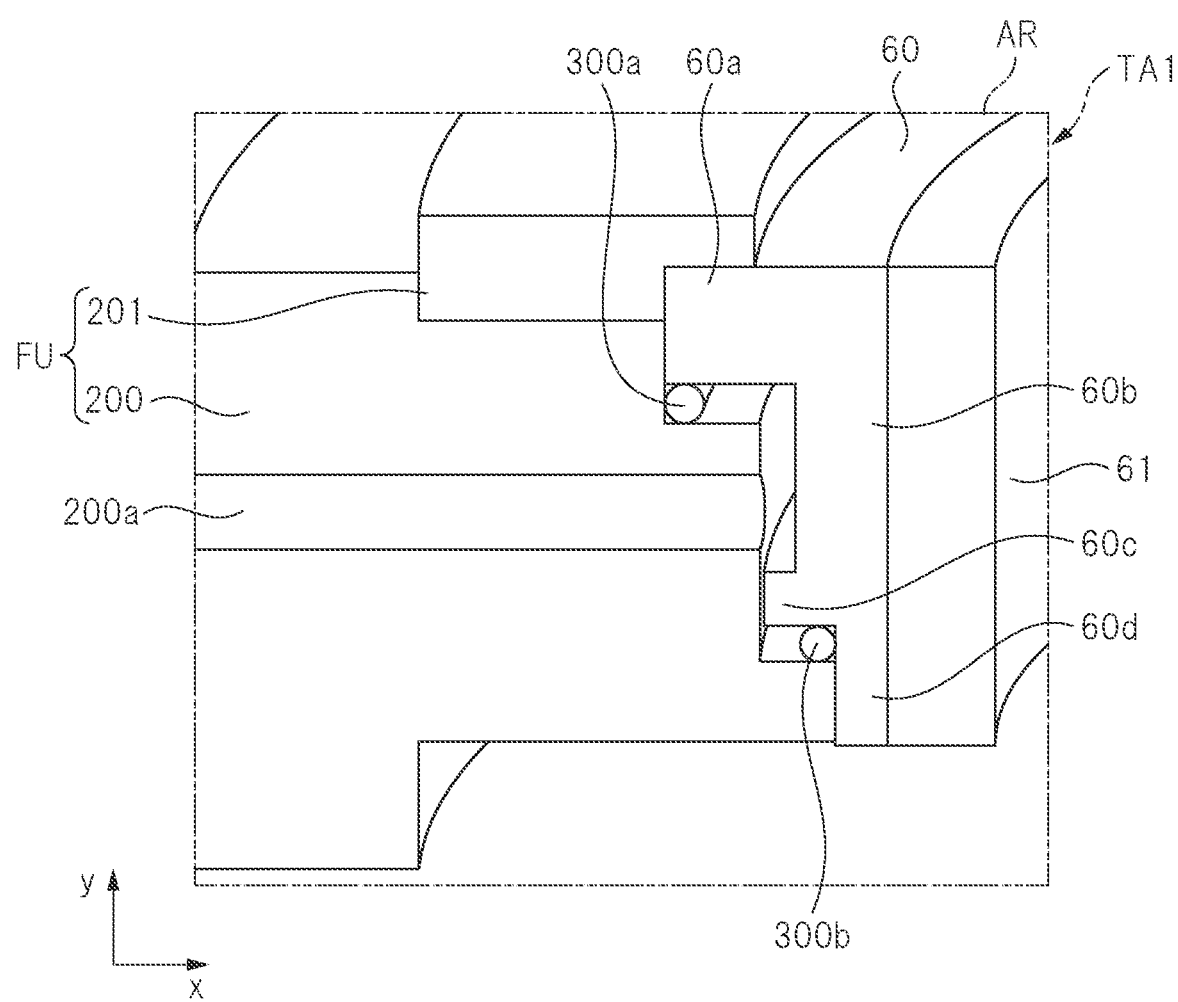
FIG. 8 is a diagram showing a partial region of FIG. 7 in an enlarged manner.

Subsequently, FIG. 8 is a diagram showing a region AR of FIG. 7 in an enlarged manner.

In FIG. 8, the backing tube 60 which is a component of the target TA1 includes a first portion 60a having a first thickness and a second portion 60b which is connected to the first portion 60a and has a second thickness thinner than the first thickness. Further, the backing tube 60 includes a third portion 60c which is connected to the second portion 60b and is thinner than the first thickness and is thicker than the second thickness and a fourth portion 60d which is connected to the third portion 60c and is thinner than the second thickness.

On the other hand, in FIG. 8, the fixing unit FU for fixing the target TA1 includes a main body portion 200 and a pressing portion 201 arranged on the main body portion 200. Further, a flow path 200a through which cooling water flows is formed in the main body portion 200 of the fixed unit FU in the related art.

The target TA1 in the related art configured in this way is fixed to the fixing unit FU provided in the film forming apparatus as described below. Namely, as shown in FIG. 8, the backing tube 60 which is a component of the target TA1 and the fixing unit FU are connected. Specifically, as shown in FIG. 8, a stepped portion formed between the first portion 60a and the second portion 60b of the backing tube 60 is connected to the main body portion 200 of the fixing unit FU via an O-ring 300a. Similarly, a stepped portion formed between the third portion 60c and the fourth portion 60d of the backing tube 60 is connected to the main body portion 200 of the fixing unit FU via an O-ring 300b. Then, as shown in FIG. 8, an upper surface of the first portion 60a of the backing tube 60 is pressed by the pressing portion 201 of the fixing unit FU.

Consequently, the flow path 200a formed in the main body portion 200 of the fixing unit FU is closed (sealed) by the O-ring 300a interposed between the main body portion 200 and the first portion 60a and the O-ring 300b interposed between the main body portion 200 and the third portion 60c. As a result, even if the cooling water for cooling the target TA1 is caused to flow through the flow path 200a, it is possible to prevent the leakage of the cooling water from the flow path 200a. At this time, the sealed flow path 200a is formed along the circumferential direction of the backing tube 60. As a result, the cooling water flows through the flow path 200a formed along the circumferential direction of the target TA1, so that the entire target TA1 can be efficiently cooled.

Note that the reason why the flow path 200a is provided between the target TA1 and the fixing unit FU and the cooling water is caused to flow through the flow path 200a is that argon ions generated by the plasma generation unit collide with the target member 61 constituting the target TA1. Namely, this is because the collision of argon ions with the target member 61 means that part of the kinetic energy of the argon ions is supplied to the target member 61 as heat energy, whereby the temperature of the target member 61 rises. Then, since the bonding material (for example, indium) adhering the target member 61 to the backing tube 60 melts when the temperature of the target member 61 rises, the target TA1 needs to be cooled with cooling water. From the above, as shown in FIG. 8, the target TA1 and the fixing unit FU in which the flow path 200a is formed in the related art are arranged such that the flow path 200a is sealed by the O-ring 300a and the O-ring 300b.

Here, the target TA1 in the related art has a vertically asymmetrical structure as shown in FIG. 8, and it can be said that configuring the target TA1 so as to have the vertically asymmetrical structure is inevitable from the viewpoint of realizing a structure that seals the flow path 200a provided in the main body portion 200 of the fixing unit FU with the simplest configuration. This is because the structure in which the two connection portions connecting the backing tube 60 and the main body portion 200 are sealed with O-rings (300a, 300b) by the pressure from above by the pressing portion 201 is the simplest configuration for sealing the flow path 200a. Then, in order to realize this simplest configuration, the O-ring 300a and the O-ring 300b must be arranged so as to be shifted in the lateral direction (x direction) as shown in FIG. 8. Namely, if the O-ring 300a and the O-ring 300b are arranged so as to be aligned with each other in the lateral direction (x direction), it is necessary to adopt a complicated structure in order to realize the structure in which the two O-rings (300a, 300b) are sealed at once by the pressure from above by the pressing portion 201.

From the above, the target TA1 in the related art inevitably has a vertically asymmetrical structure from the viewpoint of realizing the simplest configuration for sealing the flow path 200a. As described above, in the target TA1 according to the related art, the simplest configuration for sealing the flow path 200a can be realized by adopting the vertically asymmetrical structure. However, according to the studies by the inventors, it has been newly found that the consideration for improvement is necessary in the vertically asymmetrical structure from the viewpoint of extending the life of the target TA1. This point will be described below.

For example, as shown in FIG. 1, the cylindrical target TA is arranged between the plasma generation unit 13 and the film formation object SUB. Then, the plasma moves from the plasma generation unit 13 toward the film formation object SUB held by the holding unit 11. Accordingly, the plasma density varies depending on places. Specifically, the plasma density at a location near the plasma generation unit 13 is high, while the plasma density at a location away from the plasma generation unit 13 is low.

Here, in FIG. 1, since the cylindrical target TA is arranged between the plasma generation unit 13 and the film formation object SUB, the plasma density on the side closer to the plasma generation unit with respect to the target TA is higher than the plasma density on the side closer the film formation object with respect to the target TA. In other words, the plasma density on the side closer to the film formation object with respect to the target TA is lower than the plasma density on the side closer to the plasma generation unit with respect to the target TA. As a result, the frequency of the sputtering phenomenon of the target TA by argon ions on the side closer to the plasma generation unit is higher than the frequency of the sputtering phenomenon of the target TA by argon ions on the side closer to the film formation object. This is because the amount of argon ions that cause the sputtering phenomenon is larger in the region where the plasma density is high than in the region where the plasma density is low.

Figure 9:
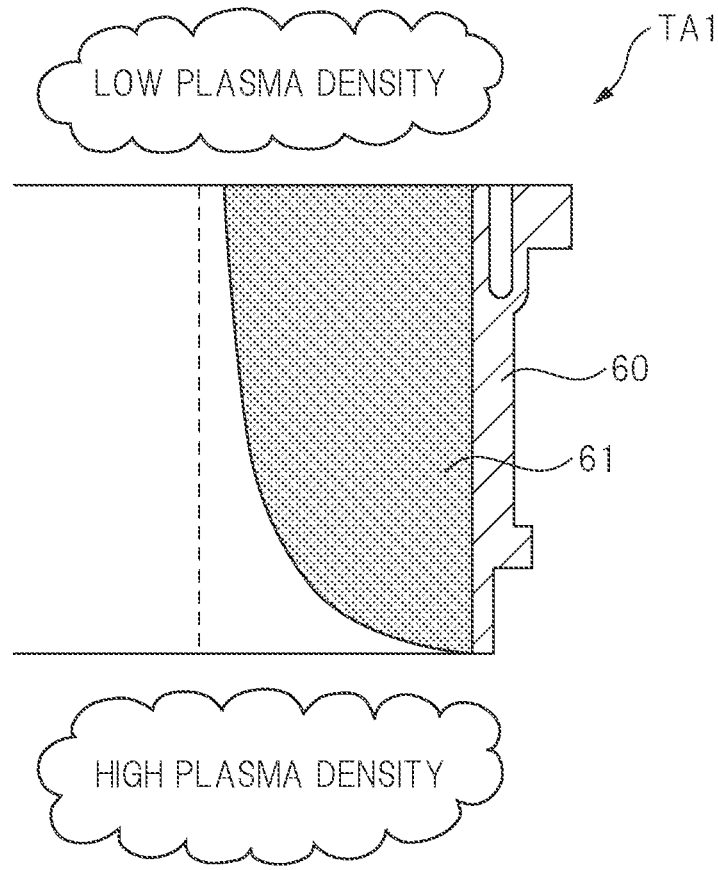
FIG. 9 is a diagram schematically showing a consumed state of a target member of the target in the related art.

Specifically, FIG. 9 is a diagram schematically showing a consumed state of the target member 61 of the target TA1 in the related art. FIG. 9 shows a portion of the target TA1 in the related art. In FIG. 9, the film formation object is arranged on the upper side of the target TA1, while the plasma generation unit is arranged on the lower side of the target TA1. Namely, in FIG. 9, the upper side of the target TA1 shows the side closer to the film formation object, while the lower side of the target TA1 shows the side closer to the plasma generation unit. Therefore, as shown in FIG. 9, the plasma density on the side closer to the plasma generation unit with respect to the target TA1 is high, while the plasma density on the side closer to the film formation object with respect to the target TA1 is low. As a result, the consumption of the target member 61 is large on the side closer to the plasma generation unit with respect to the target TA1, while the consumption of the target member 61 is small on the side closer to the film formation object with respect to the target TA1. Therefore, even if the target member 61 remains sufficiently on the side closer to the film formation object with respect to the target TA1 as shown in FIG. 9, the target TA1 in the related art will have to be replaced when the residual amount of the target member 61 decreases on the side closer to the plasma generation unit with respect to the target TA1. Here, if the target TA1 in the related art has a vertically symmetric structure, the target TA1 can be continuously used by inverting the target TA1 upside down. In this regard, as described above, the target TA1 in the related art has the vertically asymmetrical structure. Therefore, for example, when the residual amount of the target member 61 becomes small on the side closer to the plasma generation unit with respect to the target TA1, the continuous use of the target TA1 by inverting it is not possible in the related art. This means that even if the target member 61 remains sufficiently on the side closer to the film formation object with respect to the target TA1, the target TA1 must be replaced when the residual amount of the target member 61 decreases on the side closer to the plasma generation unit with respect to the target TA1. As a result, in the related art, the frequency of replacement of the target TA1 becomes high, and this increases the running cost of the film forming apparatus using the target TA1 in the related art.

As described above, the frequency of replacement of the target TA1 in the related art becomes high due to the synergistic factors of: (1) the target TA1 has a cylindrical shape and is arranged between the film formation object and the plasma generation unit, so that the plasma density on the lower side of the target TA1 (side closer to the plasma generation unit) is higher than the plasma density on the upper side of the target TA1 (side closer to the film formation object); and (2) the target TA1 has a vertically asymmetrical structure and thus cannot be used by inverting it upside down. Consequently, in the related art, the running cost of the film forming apparatus increases. Namely, in the related art, there is room for improvement from the viewpoint of reducing the running cost of the film forming apparatus by means of extending the life of the target TA1. Therefore, in the present embodiment, the running cost of the film forming apparatus is reduced by exercising ingenuity for extending the life of the target. In the following, the technical idea in the present embodiment for exercising ingenuity for extending the life of the target will be described.

Basic Idea (Features) in Present Embodiment

The basic idea in the present embodiment is that the target is designed to have a symmetrical structure so as to realize an invertible configuration. According to this basic idea, even if the consumption of the target member is large on the side closer to the plasma generation unit where the plasma density is high, the portion of the target member which has been located on the side closer to the film formation object where the plasma density is low and is thus consumed less can be rearranged on the side closer to the plasma generation unit where the plasma density is high, by inverting the target. As a result, the thickness of the target member can be restored on the side closer to the plasma generation unit where the plasma density is high. Therefore, according to the basic idea in the present embodiment, it is possible to extend the life of the target, so that the running cost of the film forming apparatus using the target in the present embodiment can be reduced.

The basic idea in the present embodiment will be described below with reference to the drawings.

Figure 10:
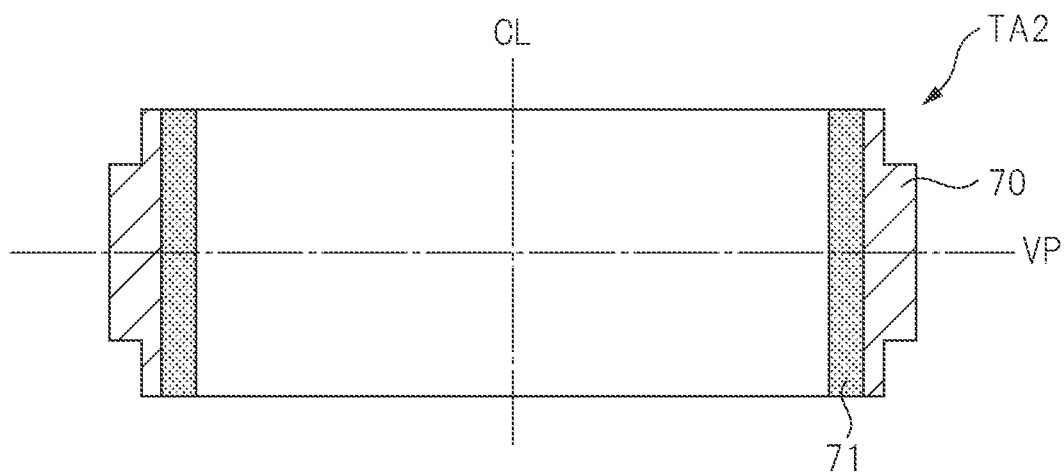
FIG. 10 is a diagram showing a schematic configuration of a target in an embodiment.

FIG. 10 is a diagram showing a schematic configuration of a target TA2 in the present embodiment.

In FIG. 10, the target TA2 in the present embodiment includes a cylindrical backing tube 70 and a target member 71 adhered to an inner wall of the backing tube 70 via a bonding material (not shown). At this time, as shown in FIG. 10, the backing tube 70 constituting part of the target TA2 has a vertically symmetrical structure. In other words, the backing tube 70 in the present embodiment is symmetrically arranged with respect to the virtual plane VP which is orthogonal to the center line CL of the cylindrical shape and divides the target member 71 into equal halves. Consequently, the target TA2 including the backing tube 70 having a symmetrical structure is configured to be vertically invertible.

FIG. 11(a) to FIG. 11(c) are diagrams for describing a basic idea in the present embodiment so as to be easily understood.

First, in FIG. 11(a), a film forming process on a film formation object is performed using the film forming apparatus to which the target TA2 in the present embodiment is attached. Then, since the plasma density on the side closer to the plasma generation unit (lower side) with respect to the target TA2 is higher than the plasma density on the side closer to the film formation object (upper side) with respect to the target TA2, the consumption of the target member 71 increases on the side closer to the plasma generation unit (lower side) with respect to the target TA2.

At this time, when the target having an asymmetric structure is used, the target cannot be used by inverting it upside down, so that it is necessary to replace the target in the state shown in FIG. 11(a). On the other hand, the target TA2 in the present embodiment has a vertically symmetrical structure. Accordingly, the target TA2 can be inverted as shown in FIG. 11(b). In this case, the portion of the target member which has been located on the side closer to the film formation object (upper side) where the plasma density is low and is thus consumed less can be rearranged on the side closer to the plasma generation unit (lower side) where the plasma density is high. Therefore, according to the present embodiment, after the state shown in FIG. 11(a), the film forming process on the film formation object can be continued by using the inverted target TA2. Thereafter, the state shown in FIG. 11(c) is obtained by repeatedly performing the film forming process on the film formation object. In the present embodiment, the target TA2 is replaced after it is in this state. As described above, according to the basic idea in the present embodiment, it is possible to extend the life of the target TA2 by adopting the target TA2 having a vertically symmetrical structure. As a result, it is possible to reduce the running cost of the film forming apparatus using the target TA2 in the present embodiment.

The basic idea in the present embodiment is to use the target TA2 having a vertically symmetrical structure, but changing the structure of the target TA2 means that it is necessary to exercise ingenuity on a mounting structure for attaching the target TA2 to the film forming apparatus. In particular, in the present embodiment, since the structure in which the target TA2 is cooled by the cooling water is adopted, further ingenuity is required. Therefore, in the following, the structure for attaching the target TA2 having a vertically symmetrical structure to the film forming apparatus will be described with reference to the drawings.

Target Mounting Structure

FIG. 12 is a diagram schematically showing a state in which the target TA2 in the present embodiment is attached to a fixing unit FU2 of the film forming apparatus. In FIG. 12, it can be seen that the target TA2 in the present embodiment is fixed by the fixing unit FU2 provided in the film forming apparatus.

Subsequently, FIG. 13 is a diagram showing a region BR of FIG. 12 in an enlarged manner.

In FIG. 13, the target TA2 in the present embodiment has the cylindrical backing tube 70 that functions as a support member. Here, the backing tube 70 has a wall portion that comes into contact with the target member 71 via an adhesive member (adhesive material) made of, for example, indium. Further, the wall portion includes a first portion 70a formed to have a first thickness, a second portion 70b formed to have a second thickness thicker than the first thickness, and a third portion 70c formed to have the first thickness. At this time, the second portion 70b is sandwiched between the first portion 70a and the third portion 70c. Also, the first portion 70a and the third portion 70c are symmetrically arranged with respect to the second portion 70b. Namely, the first portion 70a and the third portion 70c are symmetrically arranged with respect to the virtual plane which is orthogonal to the center line of the cylindrical shape and divides the target member 71 into equal halves.

Next, in FIG. 13, the fixing unit FU2 includes a main body portion 400 and a pressing portion 401 that presses the target TA2. Also, a flow path 400a through which cooling water flows is formed in the main body portion 400 of the fixing unit FU2 in the present embodiment. The fixing unit FU2 is configured to detachably attach the target TA2. In particular, since the target TA2 in the present embodiment is configured to be vertically invertible, the fixing unit FU2 is configured to be able to attach also the inverted target TA2.

The target TA2 in the present embodiment is fixed to the fixing unit FU2 provided in the film forming apparatus as described below. Namely, as shown in FIG. 13, the backing tube 70 which is a component of the target TA2 and the fixing unit FU2 are connected. Specifically, as shown in FIG. 13, a stepped portion formed between the first portion 70a and the second portion 70b of the backing tube 70 is pressed by the pressing portion 401 of the fixing unit FU2 via an O-ring (sealing member) 500a. Namely, the O-ring 500a is arranged so as to come into contact with the first portion 70a, the second portion 70b, and the pressing portion 401. On the other hand, a stepped portion formed between the second portion 70b and the third portion 70c of the backing tube 70 is connected to the main body portion 400 of the fixing unit FU2 via an O-ring 500b. Namely, the O-ring 500b is arranged so as to come into contact with the second portion 70b, the third portion 70c, and the main body portion 400. Further, as shown in FIG. 13, the main body portion 400 and the pressing portion 401 constituting the fixing unit FU2 are connected via an O-ring 500c. Namely, the O-ring 500c is arranged so as to come into contact with the main body portion 400 and the pressing portion 401.

For example, the O-ring 500a and the O-ring 500b are configured to have the same size. On the other hand, the O-ring 500c is configured to have a size larger than that of the O-ring 500a.

The flow path 400a formed in the main body portion 400 of the fixing unit FU2 is closed (sealed) by the O-ring 500a interposed between the pressing portion 401 and the second portion 70b, the O-ring 500b interposed between the main body portion 400 and the second portion 70b, and the O-ring 500c interposed between the main body portion 400 and the pressing portion 401. Here, the main body portion 400 has a side surface facing the second portion 70b, and there is a gap between the second portion 70b and the side surface. The gap is sealed by the O-ring 500a, the O-ring 500b, and the O-ring 500c, and constitutes part of the flow path 400a. At this time, cooling water for cooling the target TA2 flows also in this gap.

As described above, even if the cooling water for cooling the target TA2 is caused to flow through the flow path 400a, it is possible to prevent the leakage of the cooling water from the flow path 400a. At this time, the sealed flow path 400a is formed along the circumferential direction of the backing tube 70. As a result, the cooling water flows through the flow path 400*a* formed along the circumferential direction of the target TA2, so that the entire target TA2 can be efficiently cooled.

The target TA2 in the present embodiment has a symmetrical structure. Also, as shown in FIG. 13, the target TA2 having a symmetrical structure is fixed to the fixing unit FU2 via the two O-rings 500*a* and 500*b* arranged at the positions aligned in the x direction. However, with this configuration alone, as shown in FIG. 13, the flow path 400*a* (including the gap in contact with the wall portion of the backing tube 70) formed in the main body portion 400 of the fixing unit FU2 cannot be completely sealed. This is because the boundary between the pressing portion 401 and the main body portion 400 is not sealed in this configuration. Therefore, in the present embodiment, the flow path 400*a* is completely closed (sealed) by interposing the O-ring 500*c* between the main body portion 400 and the pressing portion 401 as shown in FIG. 13. As described above, since the target TA2 is changed to have a symmetrical structure in the present embodiment, the mounting structure of the target TA2 is different from the mounting structure of the target TA1 shown in FIG. 8 and the like. In particular, since three O-rings are necessary for closing (sealing) the flow path 400*a* formed in the main body portion 400 in the mounting structure of the target TA2 in the present embodiment, the mounting structure of the target TA2 in the present embodiment is more complicated than the mounting structure of the target TA1 in the related art in which only two O-rings are required to close (seal) the flow path. However, unlike the target TA1 in the related art, the target TA2 in the present embodiment has a symmetrical structure. Accordingly, the fixing unit FU2 can attach also the inverted target TA2 and is thus superior to the fixing unit FU in the related art.

Modification

FIG. 14 is a diagram schematically showing a structure of a target TA3 in a modification.

In FIG. 14, the target TA3 in this modification also has a vertically symmetrical structure, but unlike the target TA2 in the embodiment, a concave portion 72 is formed in the second portion of the backing tube 70. Namely, in the target TA3 in this modification, the second portion 70*b* of the backing tube 70 is configured to include the concave portion 72 thicker than the first thickness of the first portion 70*a*. In the target TA3 configured in this way, since the concave portion 72 is formed on the side surface of the backing tube 70, the surface area of the side surface of the backing tube 70 is larger than that of the target TA2 in the embodiment (first factor). Further, since the concave portion 72 is formed in the target TA3 in this modification, the thickness of the backing tube 70 in contact with the cooling water becomes thinner (second factor). As a result, according to this modification, due to the synergistic effect of the first factor and the second factor described above, the heat generated by the collision of argon ions with the target member 71 provided on the inner wall of the backing tube 70 can be efficiently dissipated by the cooling water in contact with the target TA3.

Method of Manufacturing Film Formation Object

Next, a method of manufacturing the film formation object according to the present embodiment will be described.

FIG. 15 is a flowchart for describing the flow of the method of manufacturing the film formation object.

First, in FIG. 15, the film formation object is conveyed into the film forming apparatus (S201). Then, in the film forming apparatus, a film is formed on the surface of the film formation object (S202). Next, the film formation object having the film formed on the surface is conveyed out from the inside of the film forming apparatus (S203).

Subsequently, it is determined whether or not to continue the film forming process in the film forming apparatus (S204). For example, the approximate number of film formation objects processed in the film forming apparatus before the target is inverted is examined and the number of processed objects (specified value) to be the threshold value as to whether to continue the film forming process in the film forming apparatus is determined in advance. Then, when the number of film formation objects processed in the film forming apparatus is less than the specified value, the film forming process in the film forming apparatus is continued. Namely, the process of steps S201 to S203 is repeated. On the other hand, when the number of film formation objects processed in the film forming apparatus reaches the specified value, the target is taken out from the film forming apparatus, inverted, and then mounted to the film forming apparatus (S205).

Next, in the state where the target is inverted, the film formation object is conveyed into the film forming apparatus (S206). Then, in the film forming apparatus, a film is formed on the surface of the film formation object (S207). Next, the film formation object having the film formed on the surface is conveyed out from the inside of the film forming apparatus (S208).

Subsequently, it is determined whether or not to continue the film forming process in the film forming apparatus (S209). For example, the approximate number of film formation objects processed in the film forming apparatus before the target is replaced is examined and the number of processed objects (specified value) to be the threshold value as to whether to continue the film forming process in the film forming apparatus is determined in advance. Then, when the number of film formation objects processed in the film forming apparatus is less than the specified value, the film forming process in the film forming apparatus is continued. Namely, the process of steps S206 to S208 is repeated. On the other hand, when the number of film formation objects processed in the film forming apparatus reaches the specified value, it is determined that the life of the target has expired, and the target is replaced.

As described above, the method of manufacturing the film formation object according to the present embodiment is realized. In particular, according to the present embodiment, since the target is inverted for reuse, the life of the target can be extended. As a result, according to the method of manufacturing the film formation object in the present embodiment, it is possible to reduce the running cost of the film forming apparatus.

Next, the details of the method of manufacturing the film formation object according to the present embodiment will be described with reference to the drawings. First, as shown in FIG. 16, the preparation is made for forming a film on the film formation object (first film formation object) SUB by the use of the cylindrical target TA2, which is provided between the holding unit 11 configured to hold the film formation object SUB and the plasma generation unit 13 for generating plasma and is fixed by the fixing unit FU2. This target TA2 has vertical inversion symmetry.

Subsequently, as shown in FIG. 17, a film TF is formed on the surface of the film formation object SUB by operating the film forming apparatus. For example, the film formation object SUB has a cleavage surface, and the film TF is formed on the cleavage surface of the film formation object SUB. At this time, the film TF is formed on the film formation object SUB while the target TA2 is cooled by the cooling water.

Here, as shown in FIG. 17, the thickness of the target member 71 at a position closer to the plasma generation unit 13 than to the holding unit 11 becomes thinner than the thickness of the target member 71 at a position closer to the holding unit 11 than to the plasma generation unit 13.

Then, as shown in FIG. 18, the film formation object SUB is detached from the holding unit 11.

Next, as shown in FIG. 19, after detaching the target TA2 from the fixing unit FU2, the target TA2 is inverted and attached again to the fixing unit FU2.

Here, as shown in FIG. 19, as a result of inverting the target TA2, the thickness of the target member 71 at a position closer to the plasma generation unit 13 than to the holding unit 11 becomes thicker than the thickness of the target member 71 at a position closer to the holding unit 11 than to the plasma generation unit 13.

Subsequently, as shown in FIG. 20, another film formation object (second film formation object) SUB is held by the holding unit 11. Then, as shown in FIG. 21, a film TF2 is formed on the surface of the film formation object SUB by operating the film forming apparatus. For example, the film formation object SUB has a cleavage surface, and the film TF2 is formed on the cleavage surface of the film formation object SUB. At this time, the film TF2 is formed on the film formation object SUB while the target TA2 is cooled by the cooling water.

Thereafter, as shown in FIG. 22, the film formation object SUB is detached from the holding unit 11.

As described above, the method of manufacturing the film formation object according to the present embodiment is realized.

In the foregoing, the invention made by the inventors has been specifically described based on the embodiment, but it is needless to say that the present invention is not limited to the embodiment and can be variously modified within the range not departing from the gist thereof.

The invention claimed is:

1. A target comprising:
   a target member having a cylindrical shape; and
   a support member configured to support the target member,
   wherein the support member has a wall portion in contact with the target member via an adhesive member,
   wherein the wall portion includes:
   a first portion formed to have a first thickness;
   a second portion formed to have a second thickness thicker than the first thickness; and
   a third portion formed to have the first thickness,
   wherein the second portion is sandwiched between the first portion and the third portion,
   wherein the first portion and the third portion are symmetrically arranged with respect to a virtual plane which is orthogonal to a center line of the cylindrical shape and divides the target member into equal halves, and
   wherein the second portion includes a concave portion which is thicker than the first portion and is thinner than the second thickness.

2. The target according to claim 1,
   wherein the target member is formed to have a cylindrical shape.

3. The target according to claim 1, wherein the first portion, the second portion, and the third portion are in contact with the target member.

* * * * *